(12) United States Patent
Okabe et al.

(10) Patent No.: US 8,904,111 B2
(45) Date of Patent: Dec. 2, 2014

(54) CACHE MEMORY WITH CAM AND SRAM SUB-TAGS AND GENERATION CONTROL

(75) Inventors: Sho Okabe, Chofu (JP); Koki Abe, Chofu (JP)

(73) Assignee: The University of Electro-Communications, Tokyo (JP)

( * ) Notice: Subject to any disclaimer, the term of this patent is extended or adjusted under 35 U.S.C. 154(b) by 425 days.

(21) Appl. No.: 13/503,225

(22) PCT Filed: Oct. 19, 2010

(86) PCT No.: PCT/JP2010/068298
§ 371 (c)(1),
(2), (4) Date: Apr. 20, 2012

(87) PCT Pub. No.: WO2011/049051
PCT Pub. Date: Apr. 28, 2011

(65) Prior Publication Data
US 2012/0210056 A1    Aug. 16, 2012

(30) Foreign Application Priority Data

Oct. 20, 2009   (JP) ................................. 2009-241446

(51) Int. Cl.
*G06F 12/00*   (2006.01)
*G06F 12/12*   (2006.01)
*G06F 12/08*   (2006.01)
*G11C 15/00*   (2006.01)

(52) U.S. Cl.
CPC .......... *G06F 12/0802* (2013.01); *G06F 12/123* (2013.01); *G06F 12/0804* (2013.01); *Y02B 60/1225* (2013.01); *G06F 12/0864* (2013.01); *G06F 12/0846* (2013.01); *G11C 15/00* (2013.01); *G06F 12/0895* (2013.01)
USPC .......................................... 711/128; 711/136

(58) Field of Classification Search
CPC ............ G06F 12/0846; G06F 12/0895; G06F 2212/1028; G06F 2212/221; G06F 12/0864
See application file for complete search history.

(56) References Cited

U.S. PATENT DOCUMENTS 5,574,875 A    11/1996  Stansfield et al.
5,845,309 A    12/1998  Shirotori et al.
(Continued)

FOREIGN PATENT DOCUMENTS

JP      62-293596 A    12/1987
JP      5-35599 A       2/1993
(Continued)

OTHER PUBLICATIONS

Zhang, Chuanjung, "A Low Power Highly Associative Cache for Embedded Systems", IEEE ICCD, Dept. of Computer Science and Electrical Engineering, University of Missouri-Kansas City, 2006, pp. 26-31, 6 pages.*

(Continued)

*Primary Examiner* — April Y Blair
*Assistant Examiner* — Michael C Kolb
(74) *Attorney, Agent, or Firm* — Osha Liang LLP

(57) ABSTRACT

A cache memory includes a CAM with an associativity of n (where n is a natural number) and an SRAM, and storing or reading out corresponding data when a tag address is specified by a CPU connected to the cache memory, the tag address constituted by a first sub-tag address and a second sub-tag address. The cache memory classifies the data, according to the time at which a read request has been made, into at least a first generation which corresponds to a read request made at a recent time and a second generation which corresponds to a read request made at a time which is different from the recent time. The first sub-tag address is managed by the CAM. The second sub-tag address is managed by the SRAM. The cache memory allows a plurality of second sub-tag addresses to be associated with a same first sub-tag address.

11 Claims, 16 Drawing Sheets

(56) References Cited

U.S. PATENT DOCUMENTS

| | | |
|---|---|---|
| 6,687,789 B1 | 2/2004 | Keller et al. |
| 2005/0160250 A1* | 7/2005 | Yoshimi ........................ 711/207 |
| 2007/0294480 A1 | 12/2007 | Moser |
| 2011/0026465 A1 | 2/2011 | Chen |

FOREIGN PATENT DOCUMENTS

| | | |
|---|---|---|
| JP | 6-131265 A | 5/1994 |
| JP | 8-263370 A | 10/1996 |
| JP | 2001-273193 A | 10/2001 |
| JP | 2003-519835 A | 6/2003 |
| JP | 3850669 B2 | 11/2006 |

OTHER PUBLICATIONS

Patent Abstracts of Japan, Publication No. 62-293596, dated Dec. 21, 1987, 1 page.

Patent Abstracts of Japan, Publication No. 06-131265, dated May 13, 1994, 1 page.

Patent Abstracts of Japan, Publication No. 05-035599, dated Feb. 12, 1993, 1 page.

Patent Abstracts of Japan, Publication No. 2001-273193, dated Oct. 5, 2001, 1 page.

Patent Abstracts of Japan, Publication No. 08-263370, dated Oct. 11, 1996, 1 page.

C. Zhang, "A Low Power Highly Associative Cache for Embedded Systems," IEEE ICCD, Dept. of Computer Science and Electrical Engineering, University of Missouri-Kansas City, 2006, pp. 31-26, 6 pages.

International Search Report issued in PCT/JP2010/068298, mailed on Jan. 11, 2011, with translation, 9 pages.

Written Opinion issued in PCT/JP2010/068298, mailed on Jan. 11, 2011, 4 pages.

Chuanjun Zhang, et. al. "Two Dimensional Highly Associative Level-Two Cache Design"; Computer Design, 2008; ICCD 2008; IEEE International Conference on, IEEE, Piscataway, New Jersey, U.S.A., pp. 679-684, Oct. 12, 2008, XP031407636, DOI: 10.1109/ICCD.2008.4751934 ISBN: 978-1-4244-2657-7 (6 pages).

Extended European Search Report in corresponding European Application No. 10824900.4, dated Jul. 1, 2014 (7 pages).

* cited by examiner

CACHE MEMORY WITH CAM AND SRAM SUB-TAGS AND GENERATION CONTROL

TECHNICAL FIELD

The present invention relates to a cache memory and a control method thereof and, in particular, to a cache memory adapted to be operable at low power without sacrificing performance and to a control method thereof.

BACKGROUND ART

Recently, in information processing equipment such as personal computers, cache memories have become indispensable for absorbing a difference in performance between a CPU (Central Processing Unit) and a main memory to ensure that processes are executed smoothly.

A cache memory is a high-speed, small-capacity memory used to bridge a difference in performance between a processing unit such as a CPU and a storage device by concealing a delay or a low-bandwidth in a main memory, a bus, and the like when the processing unit acquires or updates information such as data and instructions.

Conventionally, in computers, the performance of a storage device has been unable to catch up with the performance of a processing unit and a difference in these performances has been considered to be a bottleneck with respect to overall performance (von Neumann bottleneck). In addition, this difference is ever-expanding due to an accelerating increase in the performance of processing units based on Moore's Law. A cache memory is adapted to solve this difference from the perspective of memory hierarchy and is generally constructed between a main storage device (main memory) and a processing unit such as a CPU.

A 4-way set associative cache shown in FIG. 1 is known as a conventional cache memory configuration.

In the case of FIG. 1, the cache memory is constituted by a 4-way (associativity of 4) SRAM (Static Random Access Memory) in which an index address is set for each way, a tag address is provided for each index address, and data is stored in association with the tag. In FIG. 1, each way is distinguished and managed by 2-bit identification information of 00, 01, 10, and 11. Furthermore, as shown in the upper part of FIG. 1, an address comprises a tag address and an index address. In other words, in FIG. 1, when one index address is identified, four tags are identified. In this case, a way refers to the number of tag addresses that can be specified by a same index address, and is also referred to as associativity.

In the case of the cache memory shown in FIG. 1, when the CPU specifies an address and requests data readout, data is first identified based on an index address of the address. Since the 4-way constitution shown in FIG. 1 means that by identifying an index address, respective tag addresses of four ways are specified for the same index address, four readout data candidates are identified.

Next, information on a tag address of the address specified by the CPU is compared with the tag addresses of the respective ways, a comparison result is outputted, and four data items specified by the tag addresses are read simultaneously. As a result, a presence of a matching tag address means that data requested by the CPU exists in the cache memory (a cache hit). Consequently, only the data item managed under a same tag address among the four outputted data items is supplied to the CPU and the other data items are discarded. On the other hand, since an absence of a matching tag address means that data requested by the CPU does not exist in the cache memory (a cache miss), the cache memory reads out data of the requested address from the main memory, supplies the data to the CPU and, at the same time, overwrites the data on data read at an earliest timing to update the data.

However, with this method, the number of candidates that can be identified by an index address among an address are limited to the number of ways, and required data among such candidates is 0 or 1. Therefore, even if data identified by an index address is used, (number of ways−1) number of misses occur. Since an SRAM consumes a lot of power during readout, a reduction in power consumption cannot be achieved without reducing the number of misses. Therefore, power consumption cannot be reduced without reducing the number of data items identified by an index address or, in other words, the number of ways. However, a reduction in the number of ways results a decline in cache hit rate and, in turn, causes a decline in performance.

In consideration thereof, a highly-associative cache memory using a CAM (Content Addressable Memory) has been proposed in order to reduce misses attributable to the number of data items that are identified by a single index address.

FIG. 2 shows a configuration of this highly-associative cache memory. The highly-associative cache memory shown in FIG. 2 is a 32-way highly-associative cache memory with a line size of 32 bytes and a capacity of 8 KB. The highly-associative cache memory shown in FIG. 2 is partitioned into eight sub-banks (1 KB each) corresponding to the index address described above, and is designed to reduce power by activating only one sub-bank and reducing power consumption of the other sub-banks in response to a single request from a CPU (hereinafter also referred to as a cache access).

In other words, information on the index address among the address is decoded by a decoder and supplied to a sub-bank to be cache-accessed. Accordingly, only the identified sub-bank is activated, and tag address information is supplied to a CAM that manages the tag address in the activated bank. The CAM conducts a search on all ways based on the supplied tag address. Subsequently, at the single activated sub-bank, a comparison with the tag address is performed in parallel for all ways by the CAM and only data stored in correspondence with a matched tag address is outputted by an SRAM.

However, since a comparison with all tag addresses is executed for each way when the CAM is driven, there is a problem that power consumption is significantly high due to CAMs corresponding to the number of associativity being driven for each read from the CPU.

One of several methods proposed to solve this problem is known as an LPHAC (Low Power Highly Associative Cache) method (refer to Non-Patent Document 1).

As shown in FIG. 3, the LPHAC method is a method in which, for example, a tag address (hereinafter also simply referred to as a tag) constituted by 24 bits is divided into two sub-tag addresses (hereinafter also simply referred to as a sub-tag) respectively comprising most significant bits and least significant bits. As depicted by a tag address configuration (a) shown in FIG. 3, a conventional highly-associative cache is entirely constituted by a tag address managed by a CAM (hereinafter, also referred to as a CAM tag). In contrast, with the LPHAC method, as depicted by a tag address configuration (b) shown in FIG. 3, a sub-tag address constituted by least significant s-bits of the tag address is managed by a CAM (hereinafter, also referred to as a CAM sub-tag address or a CAM sub-tag), and a sub-tag address constituted by most significant bits (in this example, 24-s bits) is managed by a SRAM (hereinafter, also referred to as a SRAM sub-tag address or a SRAM sub-tag). For example, when there are 32 ways, s≥5 bits is necessary to distinguish respective lines from each other.

Operations start with a partial comparative search with a CAM sub-tag address, and a cache miss occurs when the search is not successful (when the search misses). According to Non-Patent Document 1, it is alleged that when s=8, 85% of all cache misses are discovered by a partial comparative search with CAM sub-tag addresses alone. When there is a hit in a CAM sub-tag address, a comparative search with an SRAM sub-tag address is performed on the hit line. More specifically, a partial comparative search with CAM sub-tag addresses is performed in a first half clock, and a partial comparative search with SRAM sub-tag addresses is performed on the line identified by the CAM sub-tag address in a second half clock and, at the same time, data is read out.

A specific comparative search example will now be described with reference to FIG. 4. Moreover, for convenience of description, a comparative search example having a 6-bit address will be described with reference to FIG. 4.

First, as depicted by a comparative example a shown in FIG. 4, in a case of an address "101000", a CAM sub-tag "1000", and an SRAM sub-tag "10", then it is assumed that "1111", "0101", and "1000" are registered as CAM sub-tags, and SRAM sub-tags "11", "10", and "10" are registered in correspondence thereto in a cache memory (not shown). In other words, in the comparative example a, data corresponding to addresses "111111", "100101", and "101000" is stored in the cache memory (not shown).

In the case of the comparative example a, since a CAM sub-tag of the inputted address (input address) is used and a partial comparative search of CAM sub-tags inside the cache memory is performed, "1000" in a third level is retrieved as a match as shown circled in FIG. 4 and a cache hit occurs. Therefore, since the comparative search on the SRAM sub-tag "10" registered in association with the CAM sub-tag "1000" and the SRAM sub-tag of the input address results in a match, data that has been simultaneously read out is read by the CPU.

In addition, as depicted by a comparative example b shown in FIG. 4, in a case of an address "100000", a CAM sub-tag "0000", and an SRAM sub-tag "10", then it is assumed that "1111", "0101", and "1000" are registered as CAM sub-tags, and SRAM sub-tags "11", "10", and "10" are registered in correspondence thereto in a cache memory (not shown). In other words, in the comparative example b, data corresponding to addresses "111111", "100101", and "101000" is stored in the cache memory (not shown).

In the case of the comparative example b, first, the CAM sub-tag of the input address is used to perform a comparative search on CAM sub-tags in the cache memory. As a result, "0000" is searched but there are no matching CAM sub-tags. In other words, in this case, a cache miss occurs. However, since the CAM sub-tags are 4-way, the comparative example b shown in FIG. 4 has a 1-way vacancy. Therefore, data corresponding to the address "100000" is read out from the main memory and supplied to the CPU. At the same time, as depicted by a comparative example c shown in FIG. 4, the CAM sub-tag "0000" is registered to the vacant bottommost level of the cache memory, the SRAM sub-tag "10" is further registered in association with the CAM sub-tag "0000", and data that had just been read from the main memory is registered.

Furthermore, as depicted by a comparative example d shown in FIG. 4, in a case of an input address "001000", a CAM sub-tag "1000", and an SRAM sub-tag "00", then it is assumed that "1111", "0101", and "1000" are registered as CAM sub-tags, and SRAM sub-tags "11", "10", and "00" are registered in correspondence thereto. In other words, in the comparative example d, data corresponding to addresses "111111", "100101", and "101000" is stored in the cache memory (not shown).

At this point, first, a CAM sub-tag of the input address is used and a partial comparative search of CAM sub-tags inside the cache memory is performed. As a result, the same "1000" is retrieved as shown circled. Next, although a comparative search of the SRAM sub-tag of the input address and the retrieved SRAM sub-tag "10" is performed, the SRAM sub-tags do not match as depicted by a x symbol in FIG. 4. In other words, in this case, a cache miss occurs. However, since "1000" is already registered as a CAM sub-tag, even if a 1-way vacancy exists, the SRAM sub-tag "00" ends up being redundantly registered with respect to the CAM sub-tag "1000" when data corresponding to the address "001000" is newly read out and registered from the main memory. In other words, the same CAM sub-tag "1000" is redundantly registered and SRAM sub-tags "10" and "00" are respectively registered.

However, with the LPHAC method, registration is managed so as avoid duplicating a same CAM sub-tag. Therefore, data corresponding to the address "001000" is read from the main memory and supplied to the CPU. At the same time, as depicted by a comparative example e shown in FIG. 4, the newly read SRAM sub-tag "00" is overwritten in association with the already-registered CAM sub-tag "1000", and data (not shown) that had just been read out from the main memory is registered. In other words, in this case, data corresponding to the registered address "101000" is discarded and the SRAM sub-tag registered in association with the CAM sub-tag "1000" is maintained at 1.

Non-Patent Document 1: Zhang, C.: A Low Power Highly Associative Cache for Embedded Systems, Proc. IEEE ICCD, pp. 31-36 (2006)

The LPHAC method described above is premised on performing a replacement due to a CAM sub-tag miss by an LRU (Least Recently Used) method. The LRU method is a method in which least recently accessed data is overwritten by most recently read data. In other words, from the perspective of temporal locality, it can be said that data least accessed in the past is also likely to be least accessed in the future. Therefore, this method is often adopted to improve hit rate.

Generally, a hit among the CAM sub-tags signifies a match with a CAM sub-tag corresponding to a plurality of SRAM sub-tags. However, with the LPHAC method, hit data of a partial comparative search with CAM sub-tags is narrowed down to one as described above.

In other words, when a hit occurs with a CAM sub-tag and a miss occurs with an SRAM sub-tag, the missed data is considered as being data subject to replacement (considered as being data to be replaced by newly read data and be erased). Accordingly, if the number of bits s of a CAM sub-tag is s≥5, then matching with a plurality of data items by a partial comparative search of CAM sub-tags can be avoided.

However, with the LPHAC method, when a hit occurs with a CAM sub-tag and a miss occurs with an SRAM sub-tag, hit data is narrowed down to one data item because missed data is considered replacement target data. In this case, since there is no choice but to adopt a replacement method that differs from the LRU method, there is a risk that even data accessed relatively recently may be erased due to replacement. As a result, hit rate declines.

In addition, by setting a small number of bits s of the CAM sub-tags, the likelihood of such a scenario increases. As a result, a replacement method that differs from the LRU method is more frequently adopted. Consequently, since the number of bits s of the CAM sub-tags cannot be set to a small number, the LPHAC method is limited in reducing a CAM portion which consumes a significant amount of power. As a result, there is a limit to the reduction in power consumption.

DISCLOSURE OF THE INVENTION

The present invention has been made in consideration of such circumstances, and an object thereof is to enable a reduction in power consumption without reducing a hit rate of a cache memory.

A cache memory according to a first aspect of the present invention is a cache memory having a CAM (Content Addressable Memory) with an associativity of n (where n is a natural number) and an SRAM (Static Random Access Memory), with a tag address that is constituted by a first sub-tag address and a second sub-tag address being specified by a CPU (Central Processing Unit) connected to the cache memory to store or read out corresponding data, wherein the cache memory classifies the data, according to the time at which a read request has been made, into at least a first generation for which a read request has been made recently and a second generation for which read request has been made at a not-recent time; the first sub-tag address is managed by the CAM; the second sub-tag address is managed by the SRAM; and the cache memory allows a plurality of second sub-tag addresses to be associated with a same first sub-tag address.

A cache memory according to a second aspect of the present invention is a cache memory having a CAM (Content Addressable Memory) with an associativity of n (where n is a natural number) and an SRAM (Static Random Access Memory), with a tag address that is constituted by a first sub-tag address and a second sub-tag address being specified by a CPU (Central Processing Unit) connected to the cache memory to store or read out corresponding data, the cache memory having: a generation management unit that classifies the data, according to the time at which a read request has been made, into at least a first generation for which a read request has been made recently and a second generation for which read request has been made at a not-recent time; a first search unit that manages the first sub-tag address by using the CAM and that searches for a corresponding first sub-tag address by a comparison with a first sub-tag address of the tag address specified by the CPU; a second search unit that manages the second sub-tag address by using the SRAM and that searches for a corresponding second sub-tag address by a comparison with a second sub-tag address of the tag address which includes a first sub-tag address retrieved by the first searching unit and which corresponds to the first generation data; and an output unit that outputs the data which is retrieved by the second search unit and which is stored in association with the second sub-tag address, wherein the cache memory allows a plurality of second sub-tag addresses to be associated with a same first sub-tag address.

The second search unit can be adapted such that when a corresponding second sub-tag address cannot be retrieved by a comparison with a second sub-tag address of the tag address corresponding to the first generation data, the second search unit searches for a corresponding second sub-tag address by a comparison with the second sub-tag address of the tag address corresponding to the second generation data.

The cache memory may further comprise a replacement unit that reads out, from a connected main memory, data corresponding to a tag address for which the readout has been requested when data is not retrieved by a comparison with the first sub-tag address by the first search unit or when second generation data is not retrieved by a comparison with the second sub-tag address by the second search unit, and that replaces least recently read data among the second generation data managed by the generation management unit with data read out from the main memory and, at the same time, replaces the first sub-tag address and the second sub-tag address.

The replacement unit can be adapted so as to permit an association of a plurality of the second sub-tag addresses to a single first sub-tag address and a replacement of the plurality of the second sub-tag addresses.

The generation management unit can be adapted so as to manage whether the data belongs to the first generation or to the second generation in accordance with a generation management list based on the time at which each data item managed by the second sub-tag address had been read, and when the least recently read data is replaced by the replacement unit with data read from the main memory, update the generation management list by deleting the least recently read data with respect to the time that data managed according to the second sub-tag address is read and by setting the data read from the main memory as a most recently read time.

The generation management unit can be adapted so as to manage generations based on the generation management list by classifying recently read data as first generation data and data read at a not-recent time as second generation data among the respective data managed according to the second sub-tag address.

When the associativity n is 32 and the tag address is 24 bits, then the first sub-tag address may be 2 bits and the second sub-tag address may be 22 bits.

Among data managed according to the first sub-tag address with an associativity n of 32, the first generation data may be limited to two highest ranked data items in a descending order of read times, with the most recent being the highest order.

A processor according to the present invention comprises: a plurality of the cache memories according to any one of claims 1 to 8; the CPU; a first sub-tag address extraction unit that extracts the first sub-tag address from the tag address when a read or write request is made by the CPU for data specified by the tag address; and a second sub-tag address extraction unit that extracts the second sub-tag address from the tag address when a read or write request is made by the CPU for data specified by the tag address.

A cache memory control method according to a second aspect of the present invention is a method of controlling a cache memory having a CAM (Content Addressable Memory) with an associativity of n (where n is a natural number) and an SRAM (Static Random Access Memory), with a tag address that is constituted by a first sub-tag address and a second sub-tag address being specified by a CPU (Central Processing Unit) connected to the cache memory to store or read out corresponding data, the cache memory control method including: a generation management step of classifying the data, according to the time at which a read request has been made, into at least a first generation for which a read request has been made recently and a second generation for which read request has been made at a not-recent time; a first searching step of managing the first sub-tag address by using the CAM and searching for a corresponding first sub-tag address by a comparison with a first sub-tag address of the tag address specified by the CPU; a second searching step of managing the second sub-tag address by using the SRAM and searching for a corresponding second sub-tag address by a comparison with a second sub-tag address of the tag address which includes a first sub-tag address retrieved in the first searching step and which corresponds to the first generation data; and an outputting step of outputting the data which is retrieved in the second searching step and which is stored in association with the second sub-tag address, wherein the cache memory control method allows an association of a plurality of second sub-tag addresses with a same first sub-tag address.

According to a first aspect of the present invention, a CAM (Content Addressable Memory) with an associativity of n (where n is a natural number) and an SRAM (Static Random Access Memory) are provided, a tag address constituted by a first sub-tag address and a second sub-tag address is specified by a connected CPU (Central Processing Unit) to store or read out corresponding data, the data is classified according to the time at which a read request has been made into at least a first generation for which a read request has been made recently and a second generation for which read request has been made at a not-recent time, the first sub-tag address is managed by the CAM, the second sub-tag address is managed by the SRAM, and an association of a plurality of the second sub-tag addresses with a same first sub-tag address is allowed.

According to a second aspect of the present invention, a cache memory comprises a CAM (Content Addressable Memory) with an associativity of n (where n is a natural number) and an SRAM (Static Random Access Memory) and a tag address constituted by a first sub-tag address and a second sub-tag address is specified by a connected CPU (Central Processing Unit) to store or read out corresponding data, wherein the data is classified according to the time at which a read request has been made into at least a first generation for which a read request has been made recently and a second generation for which read request has been made at a not-recent time; the first sub-tag address is managed using the CAM and a corresponding first sub-tag address is retrieved by a comparison with a first sub-tag address of the tag address specified by the CPU; the second sub-tag address is managed using the SRAM and a corresponding second sub-tag address is searched by a comparison with a second sub-tag address of the tag address which includes a retrieved first sub-tag address and which corresponds to the first generation data; and the retrieved data which is stored in association with the second sub-tag address is outputted, and an association of a plurality of the second sub-tag addresses with a same first sub-tag address is allowed.

According to an aspect of the present invention, power consumption can be reduced without reducing a cache memory hit rate.

BEST MODE FOR CARRYING OUT THE INVENTION

[Configuration Example of Cache Memory to which the Present Invention is Applied]

Figure 5:
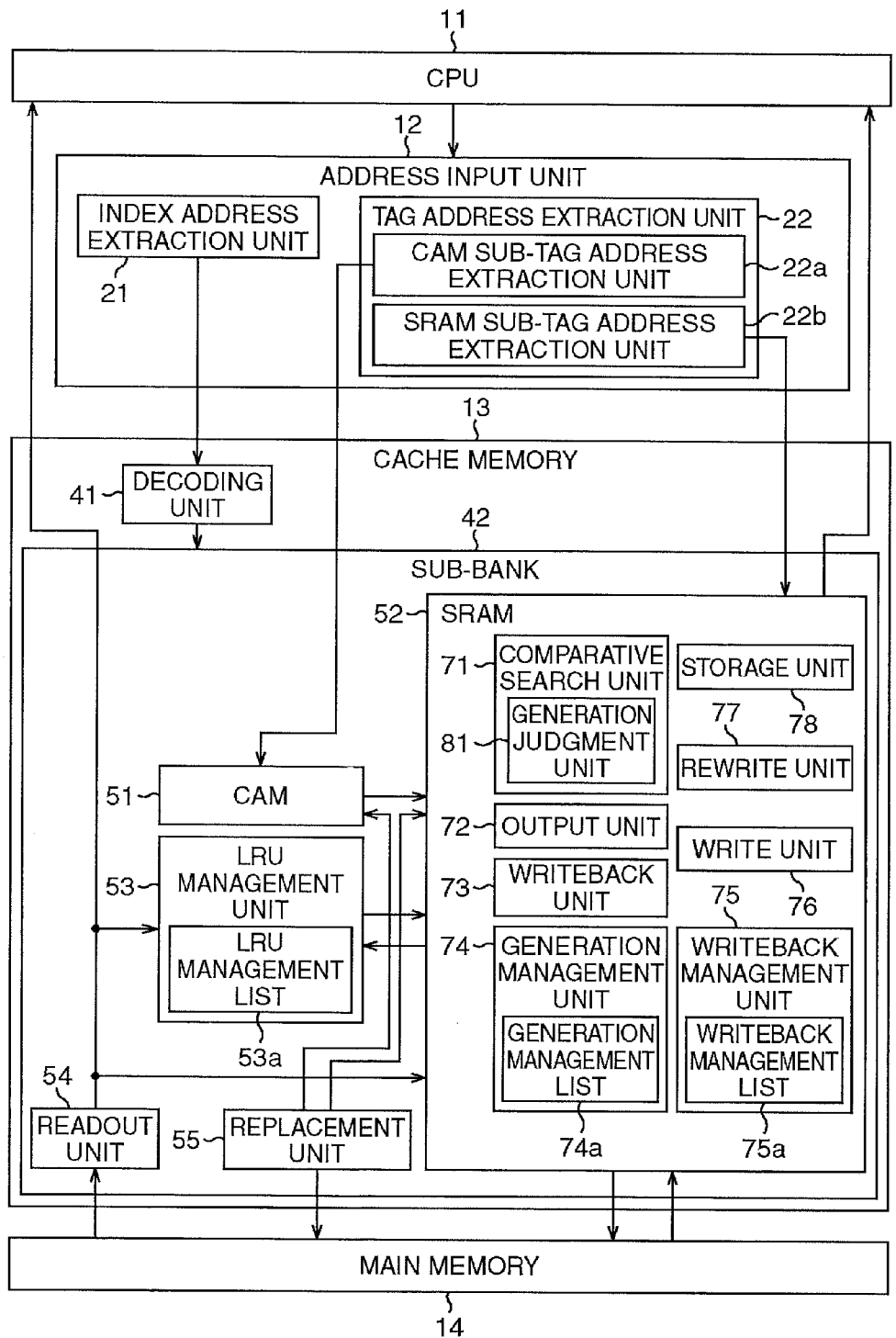
FIG. 5 is a functional block diagram for describing functions realized by a cache memory that is a configuration example of an embodiment to which the present invention is applied.

FIG. 5 is a functional block diagram showing a configuration example of an embodiment of functions realized by a cache memory to which the present invention is applied.

When executing various processes, a CPU (Central Processing Unit) 11 supplies an address of an instruction to be executed from a program counter to an address input unit 12, and makes a request for data to and, at the same time, acquires and executes the data from, a cache memory 13.

When an address specifying an instruction is supplied from the CPU 11, the address input unit 12 supplies an index address to a decoding unit 41 of the cache memory 13 and, at the same time, supplies a CAM (Content Addressable Memory) sub-tag address of the tag address to a CAM 51 of the cache memory 13 and a SRAM (Static Random Access Memory) sub-tag address of the tag address to a SRAM 52 of the cache memory 13. More specifically, the address input unit 12 comprises an index address extraction unit 21 and a tag address extraction unit 22. The index address extraction unit 21 extracts an index address from an inputted address and supplies the extracted index address to the decoding unit 41.

The tag address extraction unit 22 further comprises a CAM sub-tag address extraction unit 22a and a SRAM sub-tag address extraction unit 22b. For example, when a tag address included in an input address has X-number of bits, the CAM sub-tag address extraction unit 22a extracts s-number of least significant bits among the X-number of bits as a CAM sub-tag address and supplies the CAM sub-tag address to the CAM 51 of each sub-bank 42 within the cache memory 13. In addition, the SRAM sub-tag address extraction unit 22b extracts most significant (X−s) bits other than the CAM sub-tag address from the tag address included in the input address as an SRAM sub-tag, and supplies the SRAM sub-tag to the SRAM 52 of each sub-bank 42 within the cache memory 13.

Figure 1:
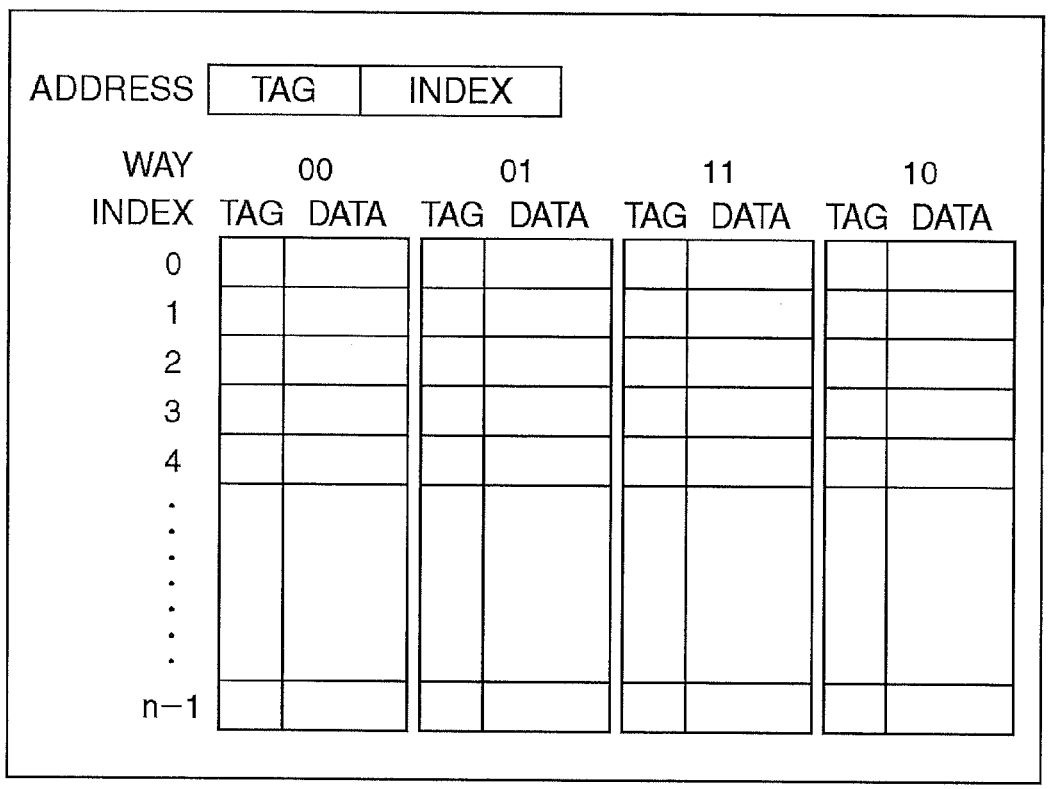
FIG. 1 is a diagram showing a configuration of a conventional cache memory.
Figure 2:
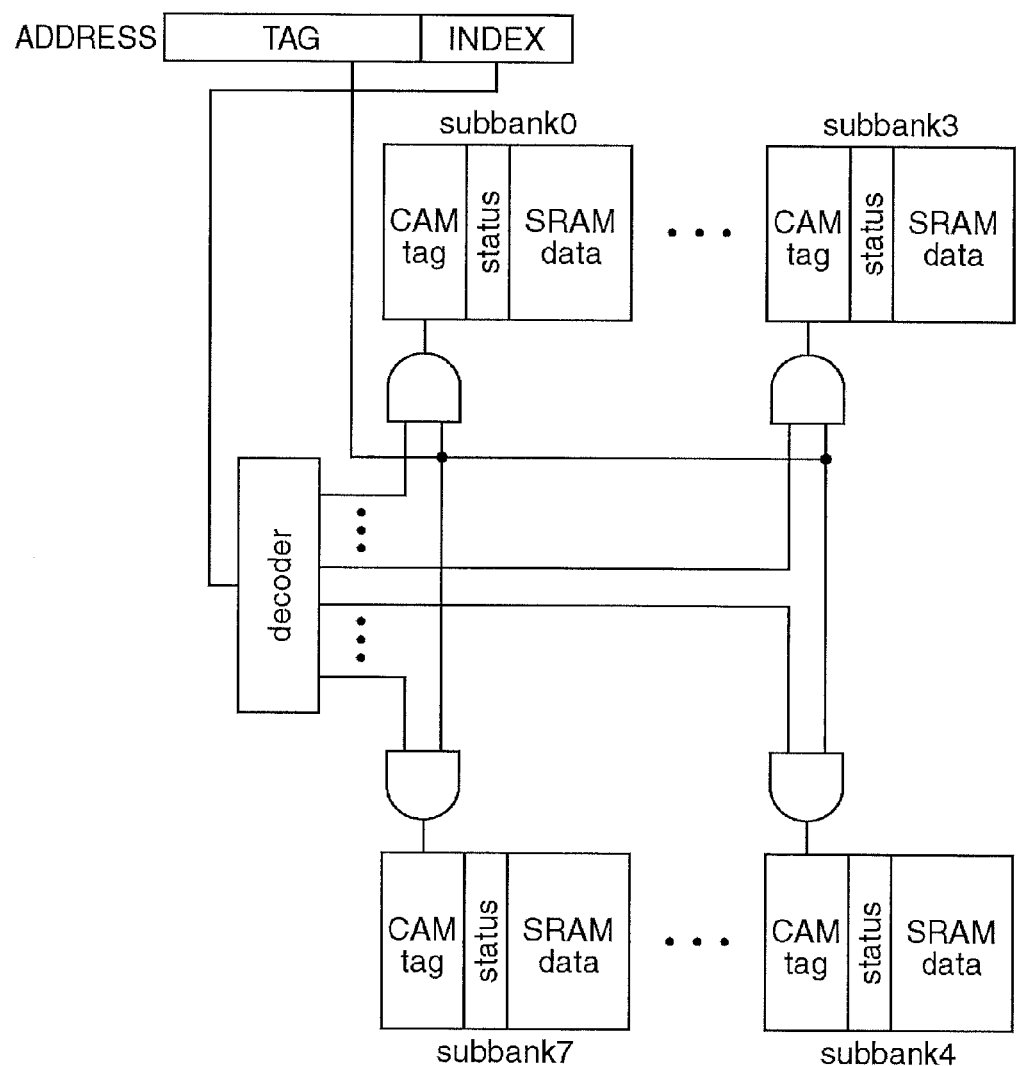
FIG. 2 is a diagram showing a configuration of another conventional cache memory.
Figure 3:
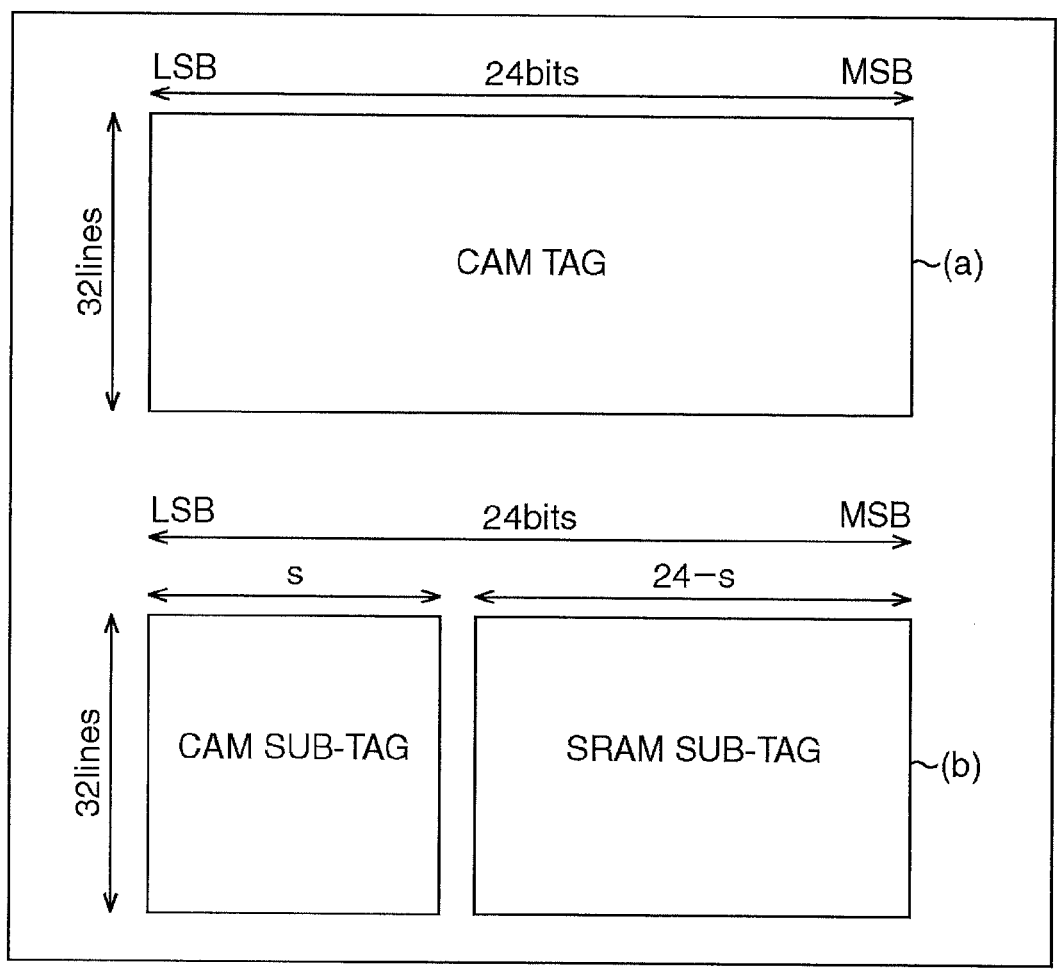
FIG. 3 is a diagram for describing an LPHAC method.
Figure 4:
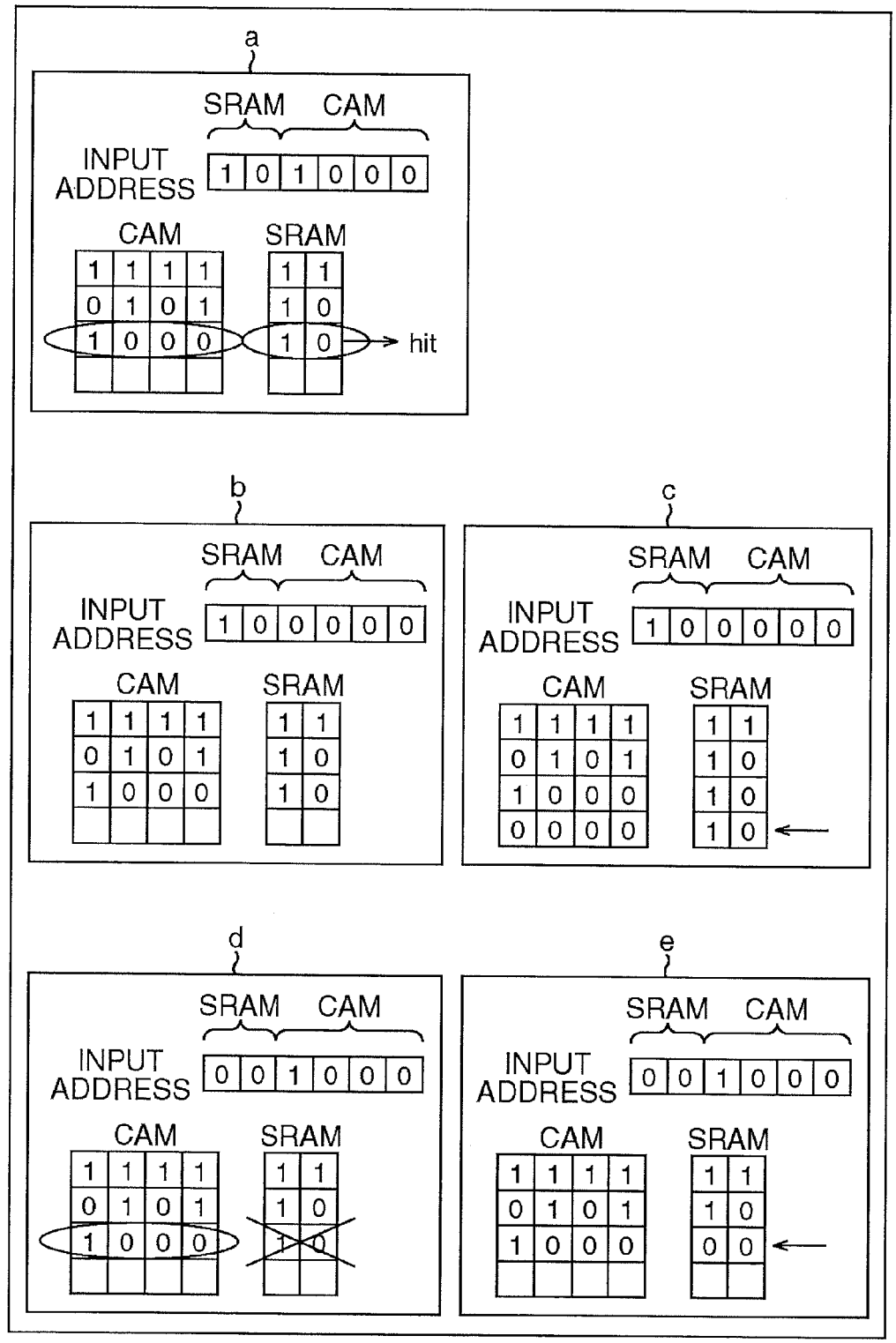
FIG. 4 is a diagram for describing the LPHAC method.

The cache memory 13 comprises the decoding unit 41 and the sub-banks 42. The decoding unit 41 analyzes the index address supplied from the address input unit 12, judges which of the sub-banks 42 is to be activated, and supplies a signal instructing activation to the sub-bank 42 to be activated. Although only one sub-bank 42 is depicted in FIG. 5 for convenience to illustrate a configuration of the sub-bank 42, a plurality of sub-banks 42 are actually provided. In other words, a relationship between the decoding unit 41 and the sub-banks 42 is similar to the configuration shown in FIG. 2, wherein only a sub-bank to which a signal instructing activation has been supplied from the decoding unit 41 is switched to an on-state, and only the sub-bank 42 switched to an on-state executes a process based on information of the tag address.

A sub-bank 42 comprises the CAM 51, the SRAM 52, an LRU management unit 53, a readout unit 54, and a replacement unit 55. The CAM 51 starts operations based on a signal instructing activation that is supplied from the decoding unit 41, searches for candidates of data at the address specified by the CPU 11 based on the CAM sub-tag address supplied from the CAM sub-tag address extraction unit 22a, and supplies a search result as a hit flag to the SRAM 52.

The SRAM 52 searches for data specified by the CPU 11 using an address, based on hit flag information from the CAM 51 and on the SRAM sub-tag address, and when data is retrieved, outputs the data to the CPU 11. In addition, when the data specified by the CPU 11 using the address cannot be retrieved, the SRAM 52 accesses a main memory 14, reads out and supplies the data to the CPU 11 and, at the same time, replaces least recent data with and stores the read data.

More specifically, the SRAM 52 comprises a comparative search unit 71, an output unit 72, a writeback unit 73, a generation management unit 74, a writeback management unit 75, a write unit 76, a rewrite unit 77, and a storage unit 78. In an initial process, the comparative search unit 71 controls a generation judgment unit 81 to first identify only data of a first generation among candidates of data which are identified by hit flag information from the CAM 51 and which are to be searched.

Generations as used herein are managed by the generation management unit 74. For example, among an order set by the times at which respective data items stored in the storage unit 78 of the SRAM 52 had recently been accessed, two highest-order data items are set as a first generation and data of lower orders is set as a second generation. In other words, data which had been recently accessed and which has a relatively high likelihood of being read is set as the first generation, and other data is set as the second generation. Moreover, while an example in which orders down to the second highest order are set as the first generation has been described, alternatively, orders down to another order may be set as the first generation and other data may be set as the second generation.

The comparative search unit 71 controls the generation judgment unit 81 in an initial process to identify first generation data that is classified as being most recent among candidates of data which are identified by the CPU 11 using an address and for which a read request has been made by the CPU 11. Subsequently, the comparative search unit 71 compares and searches respective SRAM sub-tag addresses of candidates of data specified using an address retrieved using a CAM sub-tag address identified as belonging to the first generation with a SRAM sub-tag address supplied from the SRAM sub-tag address extraction unit 22b, and when a match is retrieved, the comparative search unit 71 supplies the retrieved data to the output unit 72.

Upon acquiring the retrieved data, the output unit 72 supplies the data as the requested data which is specified by the CPU 11 using the address. In addition, when a match with the extracted SRAM sub-tag address is not retrieved among the SRAM sub-tag addresses of the candidates of data specified by the address retrieved using the CAM sub-tag identified as belonging to the first generation, the comparative search unit 71 performs a comparative search on the SRAM sub-tag addresses of data not judged by the generation judgment unit 81 to belong to the first generation or, in other words, data belonging to the second generation and the SRAM sub-tag address supplied from the SRAM sub-tag address extraction unit 22b, and when a match is retrieved, the comparative search unit 71 supplies the retrieved data to the output unit 72.

On the other hand, when data identified by the CPU 11 using an address cannot be retrieved from any of the generations, the comparative search unit 71 sends information on the CAM sub-tag address and information on the SRAM sub-tag address to the readout unit 54 and, at the same time, notifies the readout unit 54 to read out corresponding data from the main memory 14. Based on information on the CAM sub-tag address and the SRAM sub-tag address, the readout unit 54 identifies a tag address, accesses the main memory 14 to read out data corresponding to the tag address, supplies the data to the CPU 11 and, at the same time, supplies a CAM sub-tag and an SRAM sub-tag of the readout data together with the data itself to the CAM 51, the SRAM 52, and the replacement unit 55.

If the instruction from the CPU 11 is for a write process, when data to be managed by the sub-bank 42 is updated, the writeback unit 73 writes back corresponding data into the main memory 14 before data stored in the storage unit 78 of the SRAM 52 is replaced and updated.

When information on the tag address specified by the instruction from the CPU 11 is not detected and data is read out from the main memory 14, the replacement unit 55 replaces and updates data and the tag address stored until then with the new data and a new tag address.

If the instruction from the CPU 11 is for a write process, the write unit 76 rewrites data stored in the storage unit 78 with data that is a processing result from the CPU 11.

If the instruction from the CPU 11 is for a write process, the rewrite unit 77 accesses the main memory and rewrites corresponding data before the write unit 76 rewrites data stored in the storage unit 78 with data that is a processing result from the CPU 11.

Moreover, details of the LRU management unit 53, the generation management unit 74, and the writeback management unit 75 will be described later together with a data management structure.

[Data Management Structure]

Figure 6:
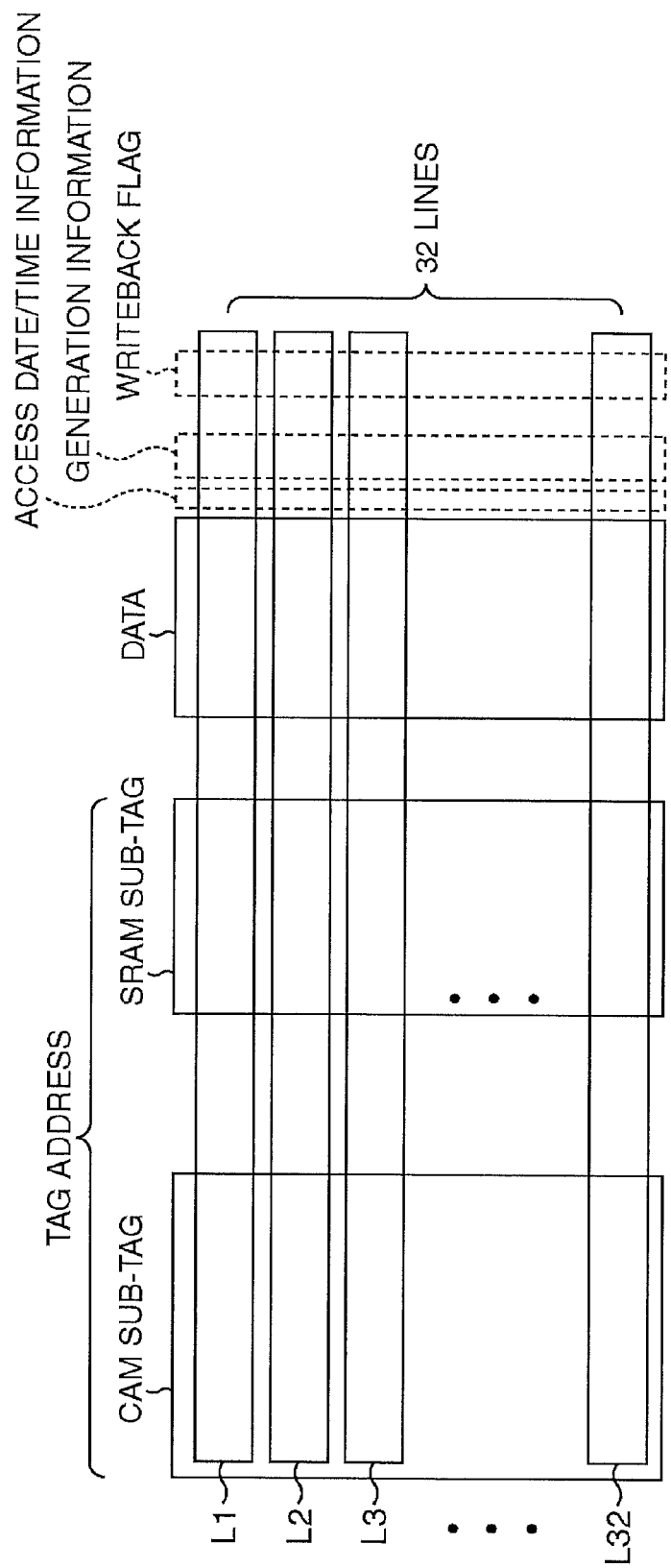
FIG. 6 is a diagram for describing a management structure of data stored in a cache memory.

Next, a management structure of data stored in the storage unit 78 will be described with reference to FIG. 6. In FIG. 6, lines in units of data items are formed in a vertical direction. In other words, FIG. 6 shows that a total of 32 data items from line L1 to L32 are recorded. Moreover, when each of the lines L1 to L32 need not be particularly distinguished, a simple designation of a line L will be used.

Each line L shown in FIG. 6 includes, from left to right, a CAM sub-tag address, an SRAM sub-tag address, data, access date/time information, generation information, and a writeback flag, and indicates information managed in units of data items. The number of the lines L correspond to the number of ways that is determined by physical constitutions of the CAM 51 and the SRAM 52. FIG. 6 shows an example having 32 ways. However, since the number of ways is determined by hardware constitution, ways may assume various numbers depending on the hardware constitution. For example, there may be 2, 4, 8, 16, or 32 ways, or a different number of ways may be adopted.

Moreover, in FIG. 6, a tag address that identifies each data item is indicated by two columns on the left hand-side of FIG. 6. In other words, due to identification of a CAM sub-tag address and an SRAM sub-tag address, data of the tag address specified by the CPU 11 is searched.

Access date/time information is information managed in units of data items (per line) according to an LRU management list 53a of the LRU (Least Recently Used) management unit 53. In other words, the LRU (Least Recently Used)

management unit 53 comprises the LRU management list 53a and manages access date/time information of recent accesses displayed on the right hand-side in the data column shown in FIG. 6 in units of data items (per line) on the LRU management list 53a. Accordingly, whenever the SRAM 52 is accessed, the LRU management unit 53 updates the LRU management list 53a and manages access date/time information in units of data items (per line) of FIG. 6. In addition, although not shown in FIG. 6, based on the information in the LRU management list 53a, the LRU management unit 53 sorts the respective lines in an order of dates/times of recent accesses and determines an order for each line.

Generation information is information managed in units of data items (per line) by a generation management list 74a of the generation management unit 74. In other words, the generation management unit 74 comprises the generation management list 74a, accesses the LRU management list 53a of the LRU management unit 53, and, in the generation management list 74a, manages data based on information arranged in the order of dates/times of recent accesses made to each line by setting a flag indicating first generation data to data items of two most recently accessed lines and by not setting a flag indicating first generation data to other data items in order to indicate that the data items are second generation data.

A writeback flag is information managed in units of data items (per line) by a writeback management list 75a of the writeback management unit 75. In other words, the writeback management unit 75 comprises the writeback management list 75a, and manages data by setting a flag to data to be written back because if the instruction from the CPU 11 is for a write process, every time data is updated, data of the main memory 14 must be written back and updated before updating the data of the SRAM 52. Accordingly, depending on whether or not the instruction from the CPU 11 is for a write process, the writeback management unit 75 updates the writeback management list 75a and manages writeback flags in units of data items (per line) in FIG. 6.

[Program Execution Process]

Next, a program execution process will be described with reference to a flow chart shown in FIG. 7.

In step S1, the CPU 11 acquires an address of an instruction to be executed from a program counter (not shown) and supplies the address to the address input unit 12. As a result of this process, the address input unit 12 accepts an input of an address from the CPU 11.

The index address extraction unit 21 extracts an index address from the inputted address. In addition, the tag address extraction unit 22 extracts a tag address from the inputted address and supplies the tag address to the CAM sub-tag address extraction unit 22a and the SRAM sub-tag address extraction unit 22b. The CAM sub-tag address extraction unit 22a extracts s-number of least significant bits of the tag address as a CAM sub-tag address and supplies the CAM sub-tag address to the CAM 51 of each sub-bank 42 within the cache memory 13. The SRAM sub-tag address extraction unit 22b extracts most significant (X−s) bits other than the CAM sub-tag address from the tag address as an SRAM sub-tag address, and supplies the SRAM sub-tag address to the SRAM 52 of each sub-bank 42 within the cache memory 13.

In step S2, the cache memory 13 executes an instruction cache process, reads out data corresponding to the address inputted by the CPU 11, and supplies the data to the CPU 11.

[Instruction Cache Process]

An instruction cache process will now be described with reference to a flow chart shown in FIG. 8.

In step S21, the cache memory 13 specifies any one of the sub-banks 42 and executes a cache hit/miss judgment process.

[Cache Hit/Miss Judgment Process]

Figure 9:
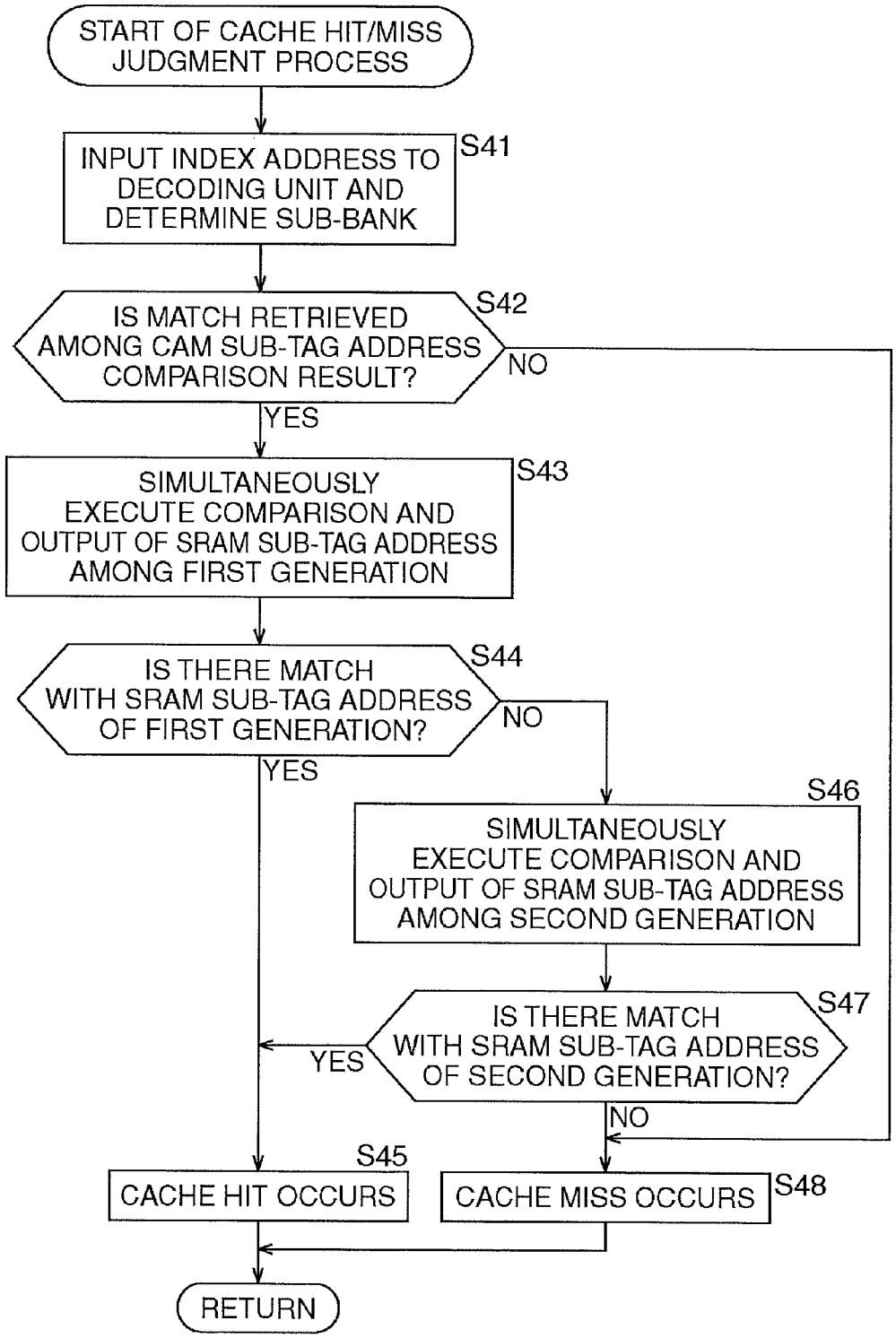
FIG. 9 is a flow chart for describing a cache hit/miss judgment process.

A cache hit/miss judgment process will now be described with reference to a flow chart shown in FIG. 9.

In step S41, the index address extraction unit 21 supplies the extracted index address to the decoding unit 41. The decoding unit 41 analyzes the index address, identifies a sub-bank 42 that is to execute a cache hit/miss process from an analysis result, and supplies a signal instructing activation to the identified sub-bank 42. As a result of this process, the sub-bank 42 to which activation had been instructed receives supply of power and starts activation. On the other hand, the sub-banks 42 to which activation had not been instructed are not activated. As a result, power consumption by sub-banks 42 that need not be involved in the process is reduced.

In step S42, the CAM 51 compares the CAM tag address supplied from the CAM sub-tag address extraction unit 22a of the tag address extraction unit 22 with a CAM tag address registered in association with data managed in the SRAM 52, and judges whether or not a matching CAM tag address is retrieved.

Figure 10:
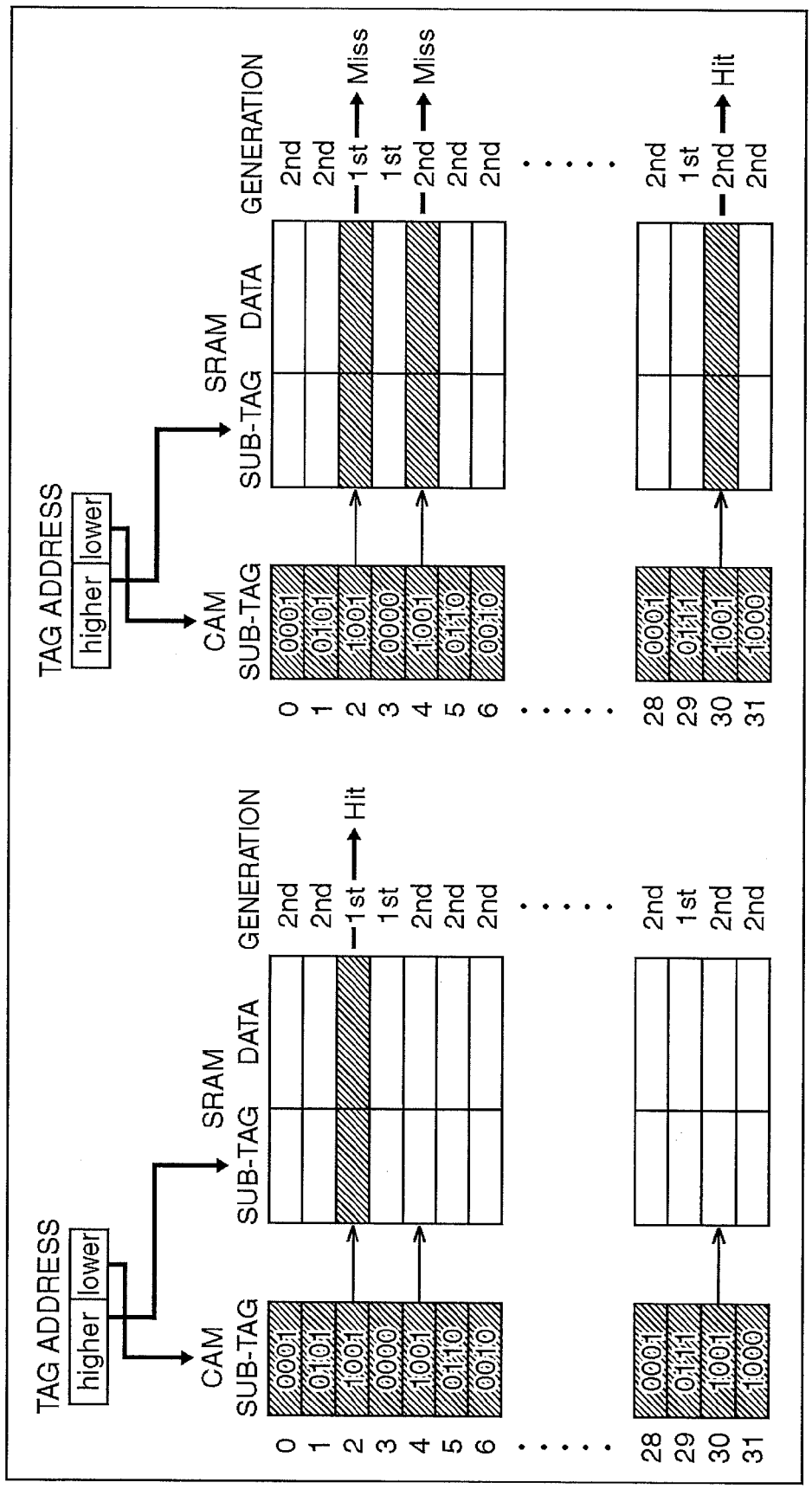
FIG. 10 is a diagram for describing a cache hit/miss judgment process.

Specifically, for example, as shown in a left part of FIG. 10, if respective CAM sub-tag addresses are "0001" for line L0, "0101" for line L1, "1001" for line L2, "0000" for line L3, "1001" for line L4, "0001" for line L5, "0010" for line L6, . . . , "0001" for line L28, "0111" for line L29, "1001" for line L30, and "1000" for line L31; and the CAM sub-tag address extracted from the inputted address is "1001", then a comparative search performed by the CAM 51 on the CAM sub-tag addresses of all of the lines L results in hits of CAM sub-tag addresses of lines L2, L4, and L30 as depicted by arrows in FIG. 10. Subsequently, in such a case, in step S42, the CAM 51 judges that there is a match between the CAM sub-tag address supplied from the CAM sub-tag address extraction unit 22a of the tag address extraction unit 22 and CAM sub-tag addresses registered in association with data managed in the SRAM 52, and the process proceeds to step S43.

Moreover, FIG. 10 shows, from left to right, a CAM sub-tag address, an SRAM sub-tag address, data, and generation information associated to each line L in a vertical direction. In addition, the generation information in FIG. 10 shows that only lines L2, L3, and L29 belong to the first generation (1st) and that other lines belong to the second generation (2nd).

In step S43, the CAM 51 sets a hit flag to a matched line L as information indicating a matched CAM tag address and a matched line L, and supplies the hit flag to the SRAM 52. As a result of this process, the comparative search unit 71 of the SRAM 52 acquires information on the matched CAM tag address and the matched line L. In other words, in the left part of FIG. 10, hit flags are set to lines L2, L4, and L30.

Subsequently, the comparative search unit 71 controls the generation judgment unit 81 to have information on a first generation line L among the lines L with matching CAM tag addresses be searched as a comparison target line L. For example, in the case of the left part of FIG. 10, since only the data of line L2 is set as the first generation, only line L2 is retrieved. Furthermore, the comparative search unit 71 compares the SRAM sub-tag address of line L2 which belongs to the first generation and which is set as a comparison target among the retrieved lines L with a matching CAM tag address with the SRAM sub-tag address supplied from the SRAM sub-tag address extraction unit 22b and, at the same time, causes the storage unit 78 to output data managed on line L2 that is set as a comparison target to the comparative search unit 71.

In step S44, the comparative search unit 71 compares the SRAM sub-tag address of line L which belongs to the first generation and which is set as a comparison target with the SRAM sub-tag address supplied from the SRAM sub-tag address extraction unit 22b, and performs a search regarding whether or not there are matches. For example, in the case of the left part of FIG. 10, since data on line L2 is the only retrieved data, the SRAM sub-tag data of line L2 is compared with the SRAM sub-tag address supplied from the SRAM sub-tag address extraction unit 22b.

In step S44, for example, in a case where both SRAM sub-tag addresses match as depicted by "hit" in the left part of FIG. 10, in step S45, the comparative search unit 71 recognizes that a cache hit has occurred and supplies data outputted from the storage unit 78 in correspondence with the matching SRAM sub-tag address to the output unit 72.

On the other hand, when there are no matching SRAM sub-tag addresses in step S44, in step S46, the comparative search unit 71 controls the generation judgment unit 81 to have information on a second generation line L among the lines L with matching CAM tag addresses be searched as a comparison target line L. For example, as shown in a right part of FIG. 10, only data of lines L4 and L30 are searched as second generation data (lines L). Furthermore, the comparative search unit 71 compares the SRAM sub-tag address of the line L which belongs to the second generation or, in other words, which is set as a comparison target among the retrieved lines L, with a matching CAM tag address with the SRAM sub-tag address supplied from the SRAM sub-tag address extraction unit 22b and, at the same time, causes the storage unit 78 to output data managed on the line L that is set as a comparison target to the comparative search unit 71.

In step S47, the comparative search unit 71 compares the SRAM sub-tag address of the line L which belongs to the second generation and which is set as a comparison target with the SRAM sub-tag address supplied from the SRAM sub-tag address extraction unit 22b, and performs a search regarding whether or not there are matches. For example, in the case of the right part of FIG. 10, since data on lines L4 and L30 is retrieved, the SRAM sub-tag data of lines L4 and L30 is compared with the SRAM sub-tag address supplied from the SRAM sub-tag address extraction unit 22b.

In step S47, for example, in a case where both SRAM sub-tag addresses match as depicted by "hit" on line L30 in the right part of FIG. 10, in step S45, the comparative search unit 71 recognizes that a cache hit has occurred and supplies data outputted from the storage unit 78 in correspondence with the matching SRAM sub-tag address to the output unit 72. In other words, in this case, both data of lines L4 and L30 has been outputted from the storage unit 78 to the comparative search unit 71. However, since the matching SRAM sub-tag address is the SRAM sub-tag address of line L30 depicted by "hit" in FIG. 10, the comparative search unit 71 supplies only the data of line L30 to the output unit 72 and, at the same time, discards the data on line L4. In this manner, the comparative search unit 71 supplies only hit data to the output unit 72 and discards data that has resulted in a cache miss.

On the other hand, when no matching CAM sub-tag addresses are found in step S42 or when, for example, the SRAM tag address set as a comparison target and the SRAM sub-tag address supplied from the SRAM sub-tag address extraction unit 22b do not match in step S47, in step S48, the comparative search unit 71 recognizes that data corresponding to the address supplied from the CPU 11 is not stored in the storage unit 78 or, in other words, recognizes that a cache miss has occurred and the process is terminated.

In other words, lines to be set as comparison targets are first searched according to CAM sub-tag addresses. Then, when matches are found, only lines belonging to the first generation among the lines with matching CAM sub-tag addresses are initially set as comparison target lines and searched according to SRAM sub-tag addresses, where a match is judged to be a cache hit. In addition, when a search performed according to SRAM sub-tag addresses on lines which belong to the first generation and which are set as comparison targets among the lines with matching CAM sub-tag addresses does not yield a match, lines which belong to the second generation and which are set as comparison targets among the lines with matching CAM sub-tag addresses are then searched according to SRAM sub-tag addresses.

Therefore, since only a part of the lines which belong to the first generation that includes recent data with a high likelihood of a matching SRAM sub-tag address can be set as comparison targets, by eliminating lines less likely to have a matching SRAM sub-tag address, a search according to SRAM sub-tag addresses can be prevented from being performed on all lines having matching CAM sub-tag addresses.

As a result, since the number of lines that result in a cache miss is reduced by not setting all of the lines as comparison targets, output operations of the storage unit 78 which has a large impact among the power consumption of the SRAM 52 can be reduced, and an overall reduction in power consumption can be achieved. Furthermore, since only a part of the lines which belong to the first generation that includes recent data with a high likelihood of a matching SRAM sub-tag address can be set as comparison targets, power consumption can be reduced without sacrificing hit rate.

Figure 8:
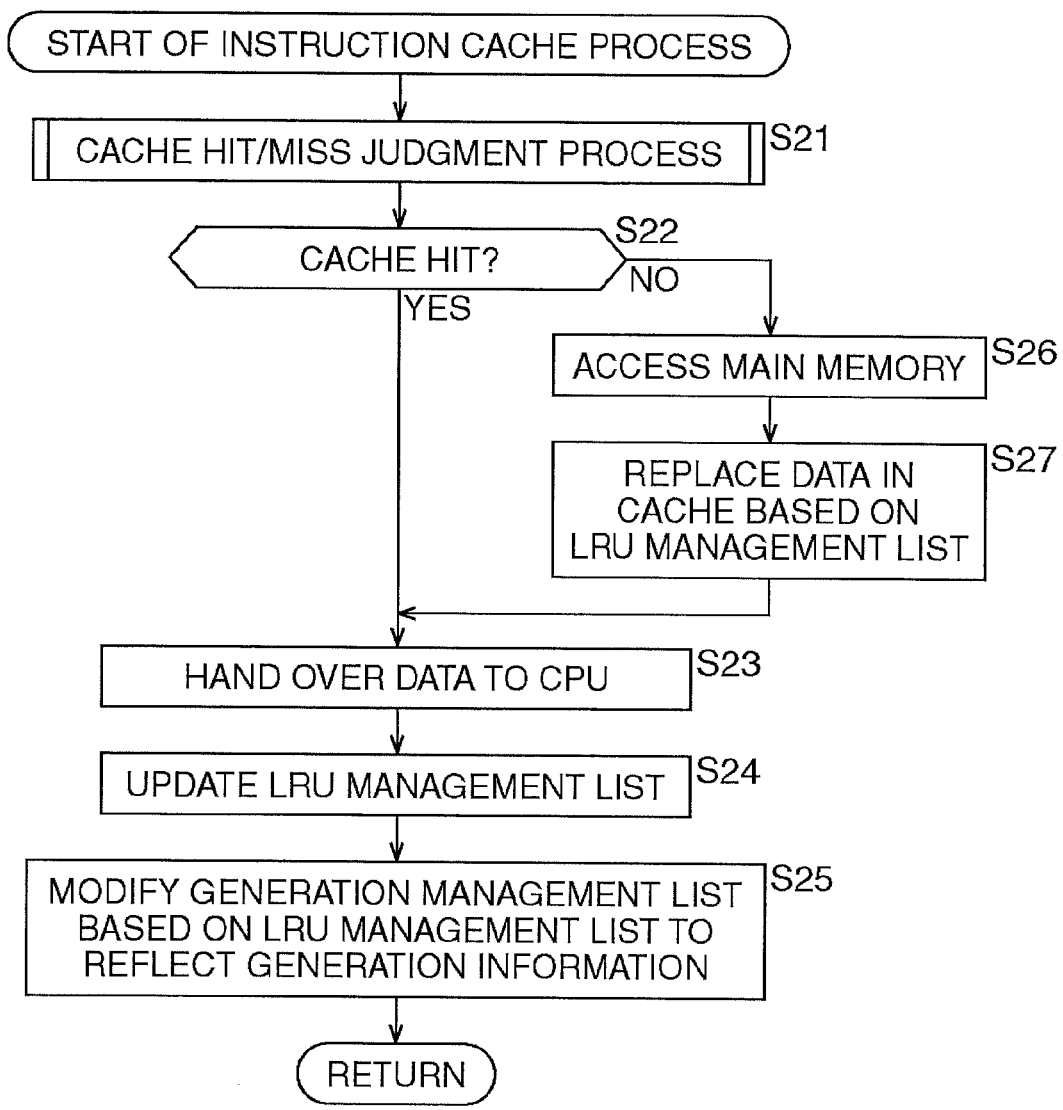
FIG. 8 is a flow chart for describing an instruction cache process.

Let us now return to the description of the flow chart shown in FIG. 8.

In step S22, the comparative search unit 71 judges whether or not a cache hit has occurred.

In step S22, for example, when a cache hit occurs as a result of the process performed in step S45 described earlier, the process proceeds to step S23.

In step S23, the output unit 72 outputs data supplied from the comparative search unit 71 to the CPU 11.

In step S24, the comparative search unit 71 supplies the LRU management unit 53 with a CAM sub-tag address and an SRAM sub-tag address of the data (line) supplied to the output unit 72, and notifies the LRU management unit 53 that corresponding data has been accessed. Based on the information on the access made, the LRU management unit 53 updates the LRU management list 53a. More specifically, among the information on the LRU management list 53a, the LRU management unit 53 updates information on the date and time at which data of the CAM sub-tag address and the SRAM sub-tag address for which a notification has been issued to the effect that an access has been made by the current time and, at the same time, updates an order of the read date and time to a highest order. Moreover, when managing the order of dates and times by using date/time information as-is may necessitate the management of an enormous amount of data. In consideration thereof, when managing the order of dates/times, for example, a 5-bit counter bit may be used when there are 32 ways to exclusively manage the order of data instead of handling date/time information as-is.

In step S25, the generation management unit 74 makes a request for, and acquires, the LRU management list 53a to/from the LRU management unit 53. In addition, for the two highest order lines in the LRU management list 53a, the generation management unit 74 updates generation information in the generation management list 74a to the first generation and, at the same time, updates generation information of other lines to the second generation.

On the other hand, when a judgment is made in step S22 that a cache hit has not occurred or, in other words, a cache miss has occurred, the process proceeds to step S26.

In step S26, since data specified by the CPU 11 using an address does not exist, the comparative search unit 71 instructs the readout unit 54 to read out data from the main memory 14 and, at the same time, supplies a CAM sub-tag address and an SRAM sub-tag address to the readout unit 54. In response to the instruction, the readout unit 54 identifies a tag address based on the CAM sub-tag address and the SRAM sub-tag address, accesses the main memory 14 and reads out data, and supplies the data to the CAM 51, the comparative search unit 71, and the replacement unit 55.

In step S27, the replacement unit 55 makes a request for, and acquires, the LRU management list 53a to/from the LRU management unit 53. Subsequently, the replacement unit 55 searches for a line having a lowest order or, in other words, an oldest data item and a tag address among the LRU management list 53a, replaces the data and the tag address with the data and the tag address supplied from the readout unit 54, and updates information in the CAM 51 and the storage unit 78 of the SRAM 52.

As described above, as a result of the instruction cache process, date/time of access in the LRU management list 53a can be updated for data for which readout of an instruction has been instructed by the CPU 11, and an order set according to the date/time can be updated sequentially. In addition, in accordance with an update of the LRU management list 53a, the generation management list 74a of the generation management unit 74 can be updated concurrently, and generation information can be updated according to the date/time of a most recent access.

Furthermore, in the process described above, the replacement unit 55 is adapted so as to even permit replacement of data in which, for example, a plurality of different SRAM sub-tag addresses are stored in the storage unit 78 in duplicate with respect to a same CAM sub-tag address. As a result, data stored in the storage unit 78 is not narrowed down to one SRAM sub-tag address for a same CAM sub-tag address, and recently accessed data is reliably replaced and stored according to the LRU method. Therefore, a reduction in cache hit rate as seen in the LPHAC method can be suppressed.

Figure 7:
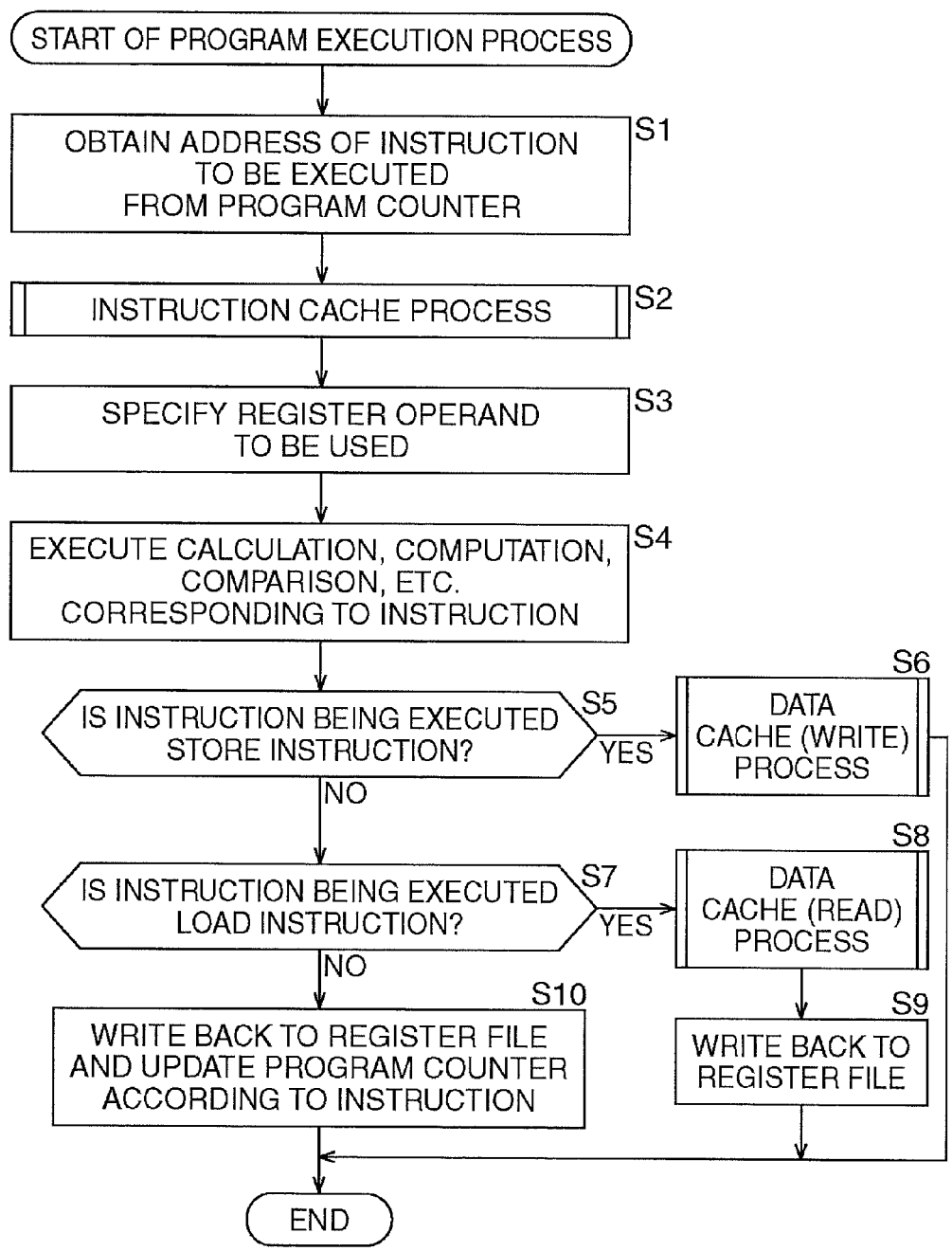
FIG. 7 is a flow chart for describing a program execution process.

Let us now return to the description of the flow chart shown in FIG. 7.

In step S2, when the instruction cache process is terminated, in step S3, the CPU 11 specifies a register operand to be used.

In step S4, the CPU 11 executes a process such as a calculation, a computation, or a comparison which corresponds to an instruction comprising data supplied from the cache memory 13.

In step S5, the CPU 11 judges whether or not the instruction being executed is a store instruction. In step S5, for example, if the instruction being executed is a store instruction, the process proceeds to step S6.

In step S6, the CPU 11 specifies an address and issues an instruction to execute a data cache process to the cache memory 13 in a similar manner as in step S1. In response thereto, the address input unit 12 supplies an index address, a CAM sub-tag address, and an SRAM sub-tag address from the inputted address to the cache memory 13. The cache memory 13 executes a data cache (write) process based on the index address, the CAM sub-tag address, and the SRAM sub-tag address.

[Data Cache (Write) Process]

Figure 11:
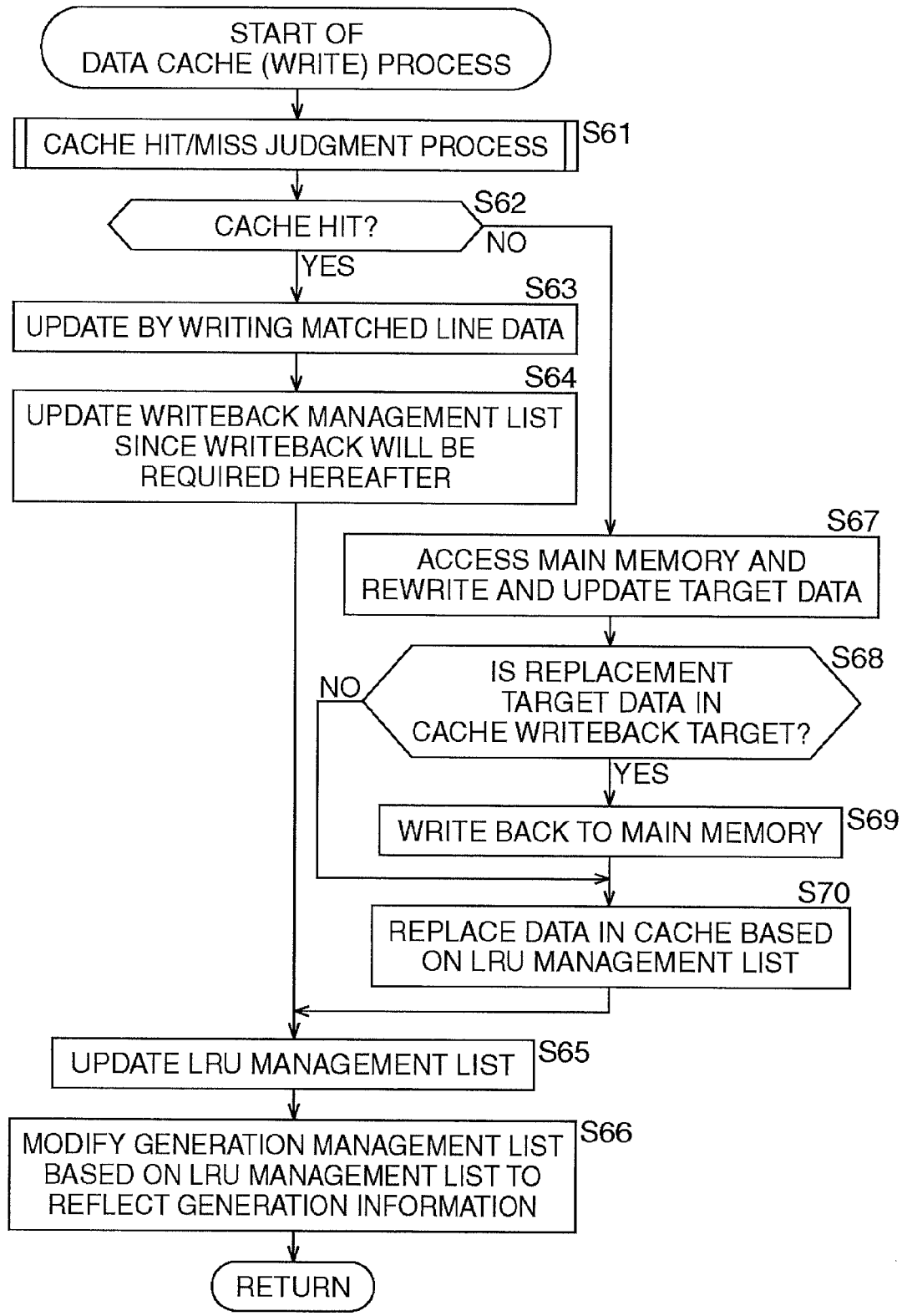
FIG. 11 is a flow chart for describing a data cache (write) process.

A data cache (write) process will now be described with reference to a flow chart shown in FIG. 11. Moreover, since the processes of steps S61, S62, S65, and S66 in the flow chart shown in FIG. 11 are similar to the processes of S21, S22, S24, and S25 described with reference to the flow chart shown in FIG. 8, a description thereof will be omitted.

Specifically, for example, when a cache hit occurs in step S62, the process proceeds to step S63.

In step S63, the comparative search unit 71 supplies information (information on a CAM sub-tag address and an SRAM sub-tag address) of a line that has been retrieved as being a cache hit to the writeback management unit 75 and the write unit 76. Subsequently, in accordance with the write instruction from the CPU 11, the write unit 76 writes data of a computation result into the storage unit 78 in association with a line identified by the retrieved CAM sub-tag address and SRAM sub-tag address.

In step S64, the writeback management unit 75 switches a writeback flag of the line identified by the CAM sub-tag address and the SRAM sub-tag address to an on-state, updates the writeback management list 75a, and records an entry in a subsequent process to the effect that the line is a writeback target.

On the other hand, in step S62, when a cache hit has not occurred or, in other words, a cache miss has occurred, the process proceeds to step S67.

In step S67, the comparative search unit 71 supplies information indicating that a cache miss has occurred to the rewrite unit 77. The rewrite unit 77 accesses the main memory 14, and rewrites data of a tag address identified by the CAM sub-tag address and the SRAM sub-tag address with data supplied from the CPU 11.

In step S68, the writeback unit 73 respectively makes requests for, and acquires, the LRU management list 53a and the writeback management list 75a to/from the LRU management unit 53 and the writeback management unit 75. Subsequently, the writeback unit 73 searches for a lowest order line or, in other words, an oldest line in the LRU management list 53a, and further checks the writeback management list 75a for the oldest line to judge whether or not a writeback flag of the oldest line is in an on-state. In step S68, for example, when the writeback flag of the lowest order line or, in other words, the oldest line that is to be replaced is turned on and the line is set as a writeback target, the process proceeds to step S69.

In step S69, the writeback unit 73 accesses the main memory 14, and writes back data of the lowest order line having a writeback flag that is turned on or, in other words, the oldest line that is a replacement target into the main memory 14.

In other words, as a result of this process, data is written back into the main memory 14 before the data is rewritten by data newly supplied from the CPU 11 and is erased from the inside of the cache memory 13.

On the other hand, in step S68, when the writeback flag of the oldest data item that is a line to be replaced is not in an on-state and has been turned off, and the line is not a writeback target, the process of S69 is skipped.

In step S70, the replacement unit 55 makes a request for, and acquires, the LRU management list 53a to/from the LRU management unit 53. Subsequently, the replacement unit 55 searches for a line having a lowest order or, in other words, an oldest data item and a tag address among the LRU management list 53a, replaces the data and the tag address with the data and the tag address supplied from the CPU 11, and updates information in the CAM 51 and the storage unit 78 of the SRAM 52.

Due to the process described above, since data cache of write data is managed, only write data with a high access frequency is managed within the cache memory 13 while other data is sequentially written back into the main memory 14.

Let us now return to the description of the flow chart shown in FIG. 7.

When the data cache (write) process is concluded by the process of step S6, the program execution process is terminated.

On the other hand, when a judgment is made in step S5 that the instruction being executed is not a store instruction, the process proceeds to step S7. In step S7, the CPU 11 judges whether or not the instruction being executed is a load instruction. In step S7, for example, if the instruction being executed is a load instruction, the process proceeds to step S8.

In step S8, the CPU 11 specifies an address and issues an instruction to execute a data cache process to the cache memory 13 in a similar manner as in step S1. In response thereto, the address input unit 12 supplies an index address, a CAM sub-tag address, and an SRAM sub-tag address from the inputted address to the cache memory 13. The cache memory 13 executes a data cache (read) process based on the index address, the CAM sub-tag address, and the SRAM sub-tag address.

[Data Cache (Read) Process]

Figure 12:
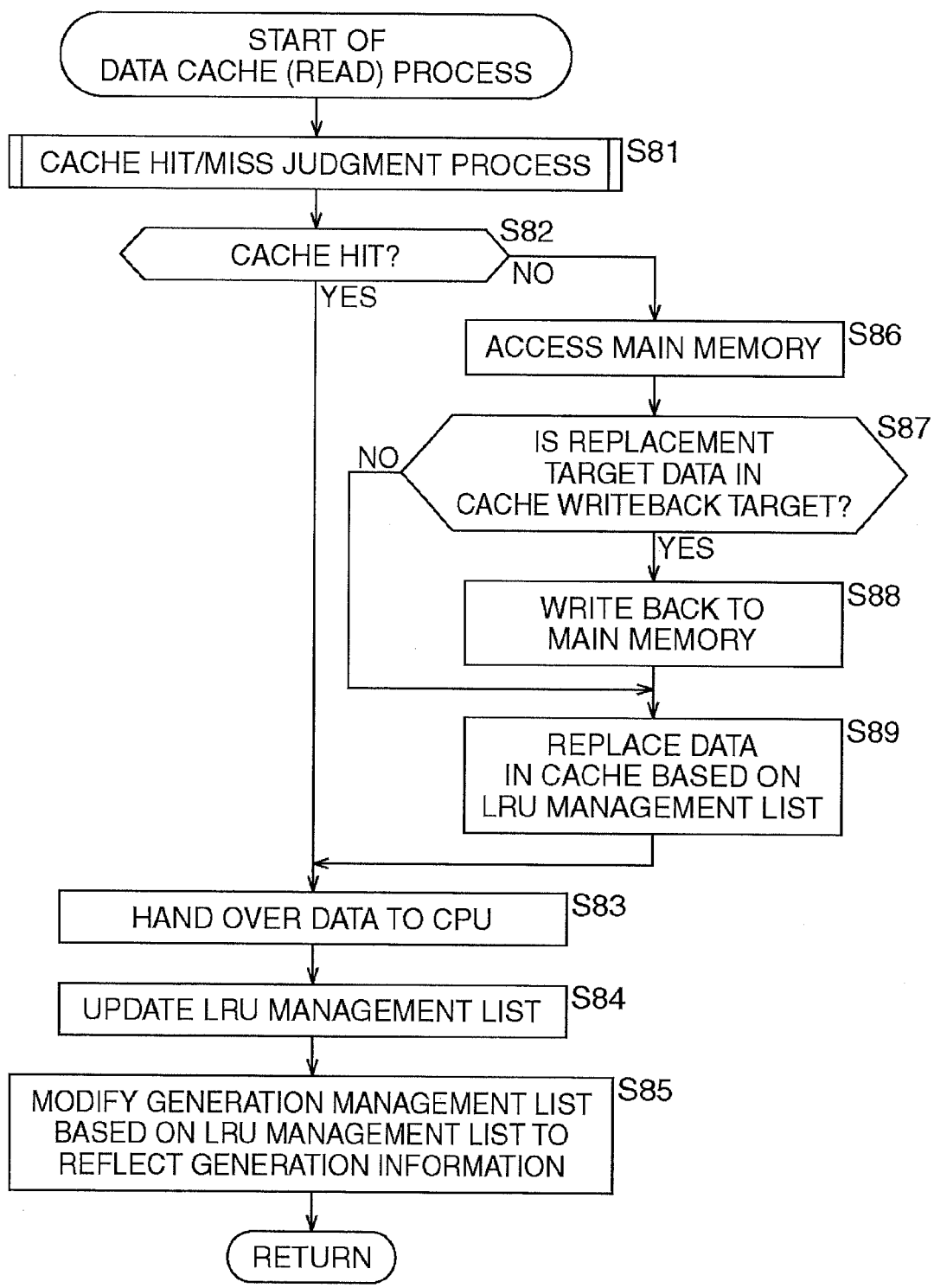
FIG. 12 is a flow chart for describing a data cache (read) process.

A data cache (read) process will now be described with reference to a flow chart shown in FIG. 12. Moreover, since the processes of steps S81 to S89 in the flow chart shown in FIG. 12 are similar to the processes of steps S61 and S62 in the flow chart shown in FIG. 11, steps S23 to S26 in the flow chart shown in FIG. 8, and steps S68 to S70 in the flow chart shown in FIG. 11, a description thereof will be omitted.

In other words, in the flow chart shown in FIG. 12, processes for writing among the process described with reference to the flow chart shown in FIG. 11 are omitted, and only a readout process from the main memory 14 is executed.

Let us now return to the description of the flow chart shown in FIG. 7.

In step S8, when the data cache (read) process is concluded, in step S9, the CPU 11 writes a process result into a register file (not shown) and terminates the process.

In addition, in step S7, when the instruction is not a load instruction, in step S10, the CPU 11 writes a process result into a register file (not shown) and further updates a program counter (not shown), and terminates the process.

Among the series of processes described above, in particular, a part of a tag address is set as an SRAM sub-tag address to be managed by the SRAM 52 and, furthermore, more recently accessed first generation data is to be preferentially searched. Therefore, since only lines which have been retrieved according to CAM sub-tag addresses and which belong to the first generation are to be searched according to SRAM sub-tag addresses, the number of data items that are simultaneously read out with a search of the SRAM 52 among associatively stored data can be narrowed down. As a result, output operations which occupy a significant part of power consumption of the SRAM 52 can be limited and power consumption can be reduced. In addition, by having first generation lines which are more frequently accessed preferentially searched in an initial process, a decline in cache hit rate can be suppressed.

Furthermore, by permitting storage of overlapping data even if there are a plurality of SRAM sub-tag addresses with respect to a single CAM sub-tag address and enabling data with a high likelihood of being accessed to be stored according to the LRU method, a decline in cache hit rate due to SRAM sub-tag addresses being narrowed down to a single SRAM sub-tag address with respect to a single CAM sub-tag address can be suppressed.

As shown, by permitting storage of overlapping data of a plurality of SRAM sub-tag addresses with respect to a single CAM sub-tag address and, at the same time, enabling more recently accessed first generation data to be preferentially searched, power consumption can be reduced without reducing the cache hit rate.

[Comparison of Miss Rates Using Benchmark Programs]

Figure 13:
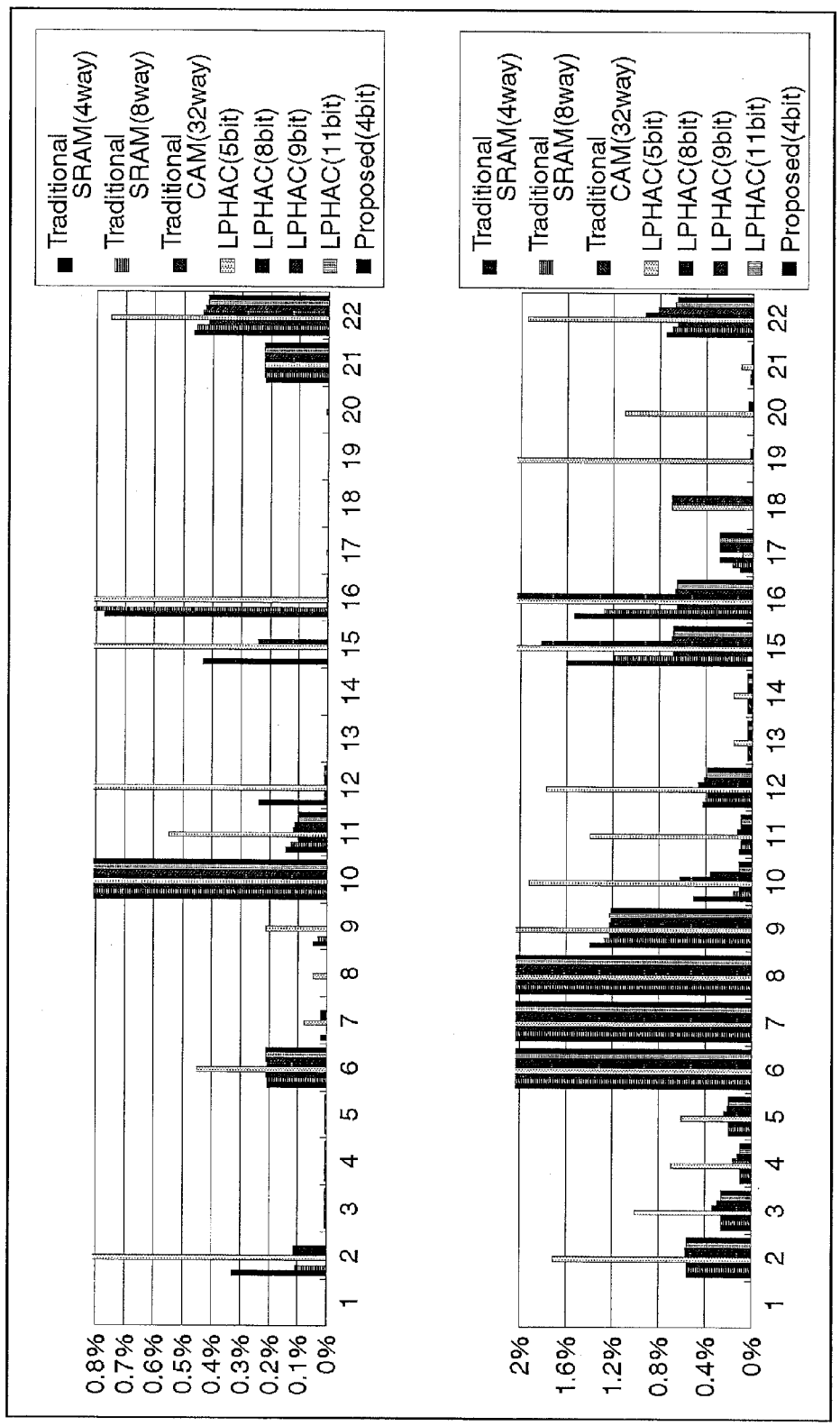
FIG. 13 is a diagram for describing an effect of the present invention.

Next, with reference to FIG. 13, miss rates and a mean value thereof when using a cache memory to which the present invention is applied will be described. Moreover, in FIG. 13, results of instruction caches are shown in an upper section and results of data caches are shown in a lower section. In addition, benchmark programs which are numbered 1 to 21 and which correspond to a horizontal axis in FIG. 13 are, in order from number 1: bitcount, qsort, susan_e, susan_c, susan_s, lame, tiff2bw, tiff2rgba, dijkstra, patricia, ispell, stringsearch, blow_d, blow_e, rijndael_d, rijndael_e, sha, crc, rawcaudio (adpcm), rawdaudio (adpcm), and untoast (gsm). Number 22 represents an overall mean value (average).

Furthermore, miss rates of each program are, from left to right: a traditional 4-way SRAM, a traditional 8-way SRAM, a traditional 32-way CAM, the LPHAC method when a tag address is 24 bits and the number of bits s of a CAM sub-tag address is S=5, 8, 9, 11, and an example (s=4) according to the present invention (represented by black).

As illustrated in the upper section of FIG. 13, the mean value denoted by number 22 shows that the instruction cache miss rate of the LPHAC method is higher than that of the traditional CAM. In particular, the miss rate is distinctly higher when the number of bits s of the CAM sub-tag address is s=5. This is presumably because there are many cases where a comparative search according to CAM sub-tag addresses is successful (results in a hit) but a comparative search according to SRAM sub-tag addresses is not (results in a miss). In addition, when the number of bits s of the CAM sub-tag address is s=8, 9, although the miss rates of many benchmark programs have values similar to that of the traditional CAM, rijndael_d and qsort have high miss rates. When the number of bits s of the CAM sub-tag address is s=11, the miss rate is approximately equal to that of the traditional CAM in all of the benchmark programs. On the other hand, it is shown that with the cache memory according to the present invention, the miss rate is not affected even when the number of bits s of the CAM sub-tag address is s=4.

In other words, as far as mean values are concerned, while the LPHAC method when the number of bits s of the CAM sub-tag address is s=5, 8, 9, 11 has respective mean values of 0.75%, 0.43%, 0.43%, and 0.42%, the cache memory according to the present invention has the same mean value as the traditional CAM of 0.42% when the number of bits s of the CAM sub-tag address is s=4.

In addition, as illustrated in the lower section of FIG. 13, data caches have a similar tendency as that of instruction caches. Specifically, in the LPHAC method, rijndael_d and rijndael_e have high miss rates when the number of bits s of the CAM sub-tag address is s=8, and patricia and crc have high miss rates even when the number of bits s of the CAM sub-tag address is s=9.

On the other hand, in a similar manner to instruction caches, the cache memory according to the present invention has a similar miss rate as the traditional CAM and is not affected even when the number of bits s of the CAM sub-tag address is s=4. As far as mean values denoted by number 22 are concerned, while the LPHAC method when s=5, 8, 9, 11 has respective mean values of 1.95%, 0.91%, 0.80%, and 0.67%, the cache memory according to the present invention has the same mean value as the traditional CAM of 0.66% when the number of bits s of the CAM sub-tag address is s=4.

As shown, since the cache memory according to the present invention does not narrow down the number of cache line hits to one cache line in a partial comparative search with CAM sub-tag addresses, the LRU method can always be adopted. As a result, a decline in the hit rate can be suppressed. In addition, unlike the LPHAC method, a miss rate of a particular benchmark is not significantly affected by a magnitude of the number of bits s of the CAM sub-tag address.

Moreover, compared to mean miss rates of traditional 4-way and 8-way SRAMs, mean miss rates of the traditional CAM and the cache memory according to the present invention are respectively smaller by 10.7% and 8.6% in the case of instruction caches and respectively smaller by 11.6% and 5.0% in the case of data caches.

[Comparison of Power Consumption]

Next, an evaluation of power consumption will be described with reference to FIGS. 14 to 16. The evaluation of power consumption of the present invention is performed based on the mean values obtained when executing the benchmark programs described above and is represented by a power consumption E expressed by the following equation (1).

$$E = E\text{tag} + E\text{data} \tag{1}$$

Etag in equation (1) may be expressed by equation (2) below.

$$E\text{tag} = E\text{CAM} + E\text{SRAM} \tag{2}$$

ECAM and ESRAM in equation (2) may respectively be expressed by equations (3) and (4) below.

$$E\text{CAM} = \alpha \times w \times s \times NC \tag{3}$$

$$E\text{SRAM} = (t-s) \times (NS1 + NS2) \tag{4}$$

In the equations above, $\alpha$ denotes power consumption required to detect 1 bit of the CAM 51, w denotes the number of ways, s denotes the number of bits of a CAM sub-tag address, t denotes the number of bits of a tag address, NC denotes the number of accesses made to the CAM, NS1 denotes the number of accesses made to data of an SRAM managed as being first generation, and NS2 denotes the number of accesses made to data of an SRAM managed as being second generation.

Furthermore, Edata may be expressed by equation (5) below.

$$E\text{data} = \beta \times l \times (NS1 + NS2) \tag{5}$$

In equation (5), $\beta$ denotes power consumption required to detect 1 bit of the SRAM and l denotes a data bit length of each line.

First, with reference to FIG. 14, a relationship between the power consumption Etag required for tag address detection and the power consumption Edata required for data output; and the bit lengths s of respective CAM sub-tag addresses will be described.

Figure 14:
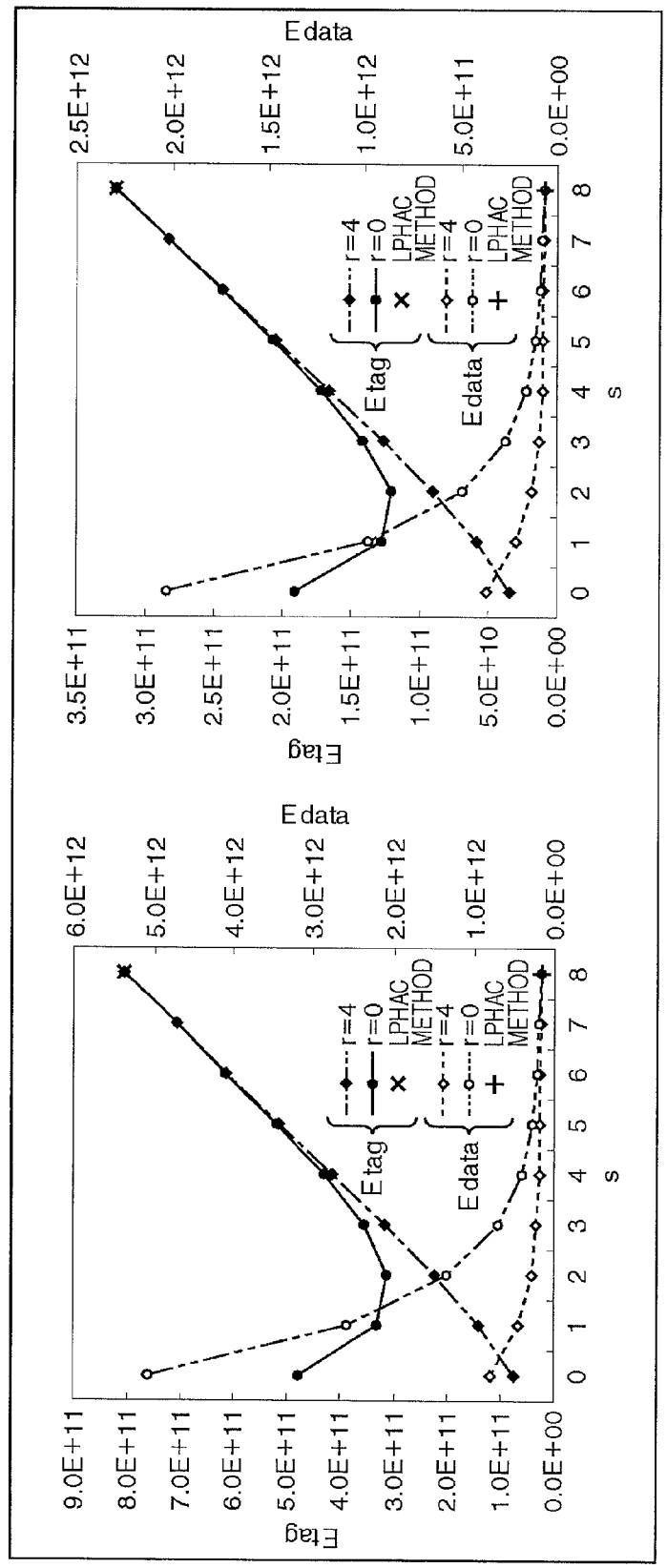
FIG. 14 is a diagram for describing an effect of the present invention.

In FIG. 14, a left part represents an instruction cache process and a right part represents a data cache process. In addition, in either part, a solid line and a dot-dash line depict the power consumption Etag required for tag address detection, and a dotted line and a two-dot dashed line depict the power consumption Edata required for data output. The power consumption Etag required for tag address detection is in units of power required to detect 1 bit of an SRAM tag address. The power consumption Edata required for data output is in units of power required to output 1 bit of SRAM data. Moreover, a single line consists of 256 bits. In addition, power consumption $\alpha$ required to detect 1 bit of the CAM 51 is assumed to be $\alpha$=5, and comparisons are made with respect to CAM sub-tag addresses having numbers of bits s of s=0 to 8 and to numbers of first generation ways r of r=0, 4. For comparison, a power consumption Etag (depicted by ×) required for tag address detection and a power consumption Edata (depicted by +) required for data output by the LPHAC method for a CAM sub-tag address with number of bits s=8 are also shown.

With the LPHAC method, since reducing the number of bits s of a CAM sub-tag address increases miss rate, the number of bits s of a CAM sub-tag address must be s≥8. In contrast, with the cache memory according to the present invention, the number of bits s of a CAM sub-tag address may be s<8.

The power consumption Etag required for tag address detection decreases linearly when the number bits s of a CAM sub-tag address is reduced. Compared to a CAM sub-tag address where the number of bits s=8, the power consumption required for tag address detection falls to almost half for a CAM sub-tag address where the number of bits s=4.

The power consumption Edata required for data output increases rapidly under a certain value when the number bits s of a CAM sub-tag address is reduced. Values of the number of bits s of a CAM sub-tag address during this rapid increase differs depending on the number of ways r of a first generation SRAM. While a rapid increase occurs when the number of bits s of a CAM sub-tag address is s≤6 if the number of ways r=0, there is hardly any change up to when the number of bits s of a CAM sub-tag address is s=4 if the number of ways r=4. Although the LPHAC method results in values similar to the cache memory according to the present invention for both the power consumption Etag required for tag address detection and the power consumption Edata required for data output, it is difficult to bring down the number of bits s of a CAM sub-tag address.

With the cache memory according to the present invention, when the number of ways r=0, it is difficult to bring down the number of bits s of a CAM sub-tag address since generations are not divided. However, as shown by waveform charts a and b of FIG. 15, the effect of dividing generations becomes apparent when the number of ways r=4.

Figure 15:
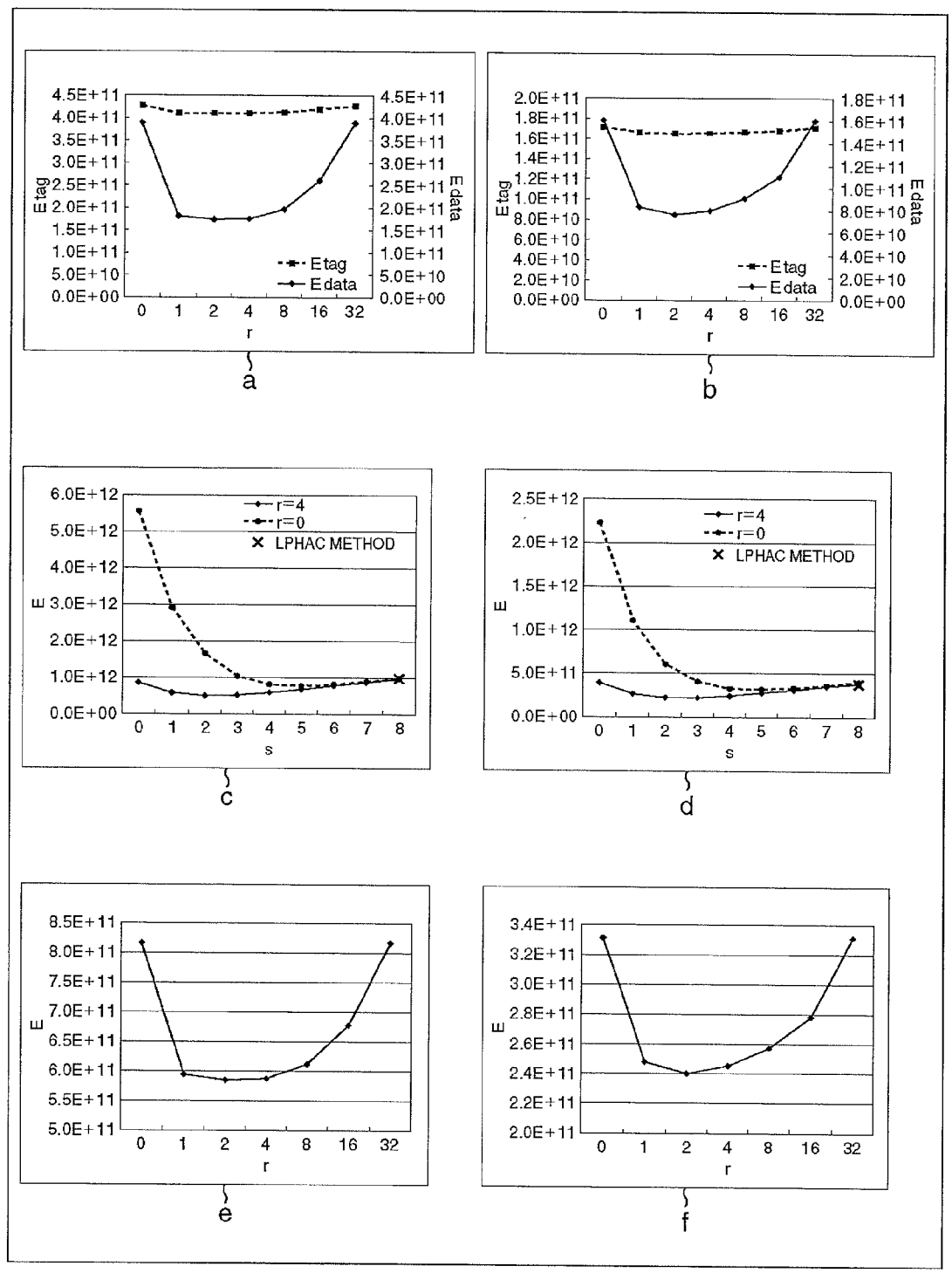
FIG. 15 is a diagram for describing an effect of the present invention.

The waveform charts a and b of FIG. 15 show, respectively for instruction caches and data caches, a relationship between the power consumption Etag required for tag address detection which is depicted by a dotted line and the power consumption Edata required for data output which is depicted by a solid line, and the number of ways r when the number of bits s of a CAM sub-tag address is s=4 and the number of ways r are varied among r=0, 1, 2, 4, 8, 16, and 32.

Specifically, for both instruction caches and data caches, power consumption is minimum in a vicinity of the number of ways r=2 to 4. A minimum value of power consumption appears depending on the value of the number of way r because the number of comparative searches performed with data set to the second generation increases when the number of ways r is small, and a frequency of multiple comparative searches performed with data set to the first generation rises when the number of ways r is large.

Meanwhile, with an SRAM, there is a known principle in which power of a logic circuit such as a decoder and a comparator is significantly lower than power required for charge and discharge of a bit line capacitance that flows when a word line is being driven (refer to Itoh, K., Sasaki, K. and Nakagome, Y.: Trends in low-power RAM circuit technologies, Proceedings of the IEEE, Vol. 83, No. 4, pp. 524-543 (1995)). In consideration thereof, when contemplating the power consumption E of the cache memory according to the present invention, in accordance with the principle, an approximation is used in which the power required to detect 1 bit of a SRAM sub-tag address is equal to power required to output 1 bit of a SRAM sub-tag address. In other words, in equation (5), the power consumption β required to output 1 bit of SRAM data is assumed to be β=1.

Waveform charts c and d of FIG. 15 show, respectively for instruction caches and data caches, the power consumption E of instruction caches and data caches when varying the number of bits s of a CAM sub-tag address, where a dotted line depicts a case where number of ways r=0 and a solid line depicts a case where number of ways r=4. In addition, waveform charts e and f of FIG. 15 show the power consumption E of instruction caches and data caches when the number of ways r=4 and the number of first generation ways r is varied. These waveform charts show that, with the cache memory according to the present invention, when the number of ways r=4, power consumption is minimum when the number of bits s of a CAM sub-tag address is s=2.

Figure 16:
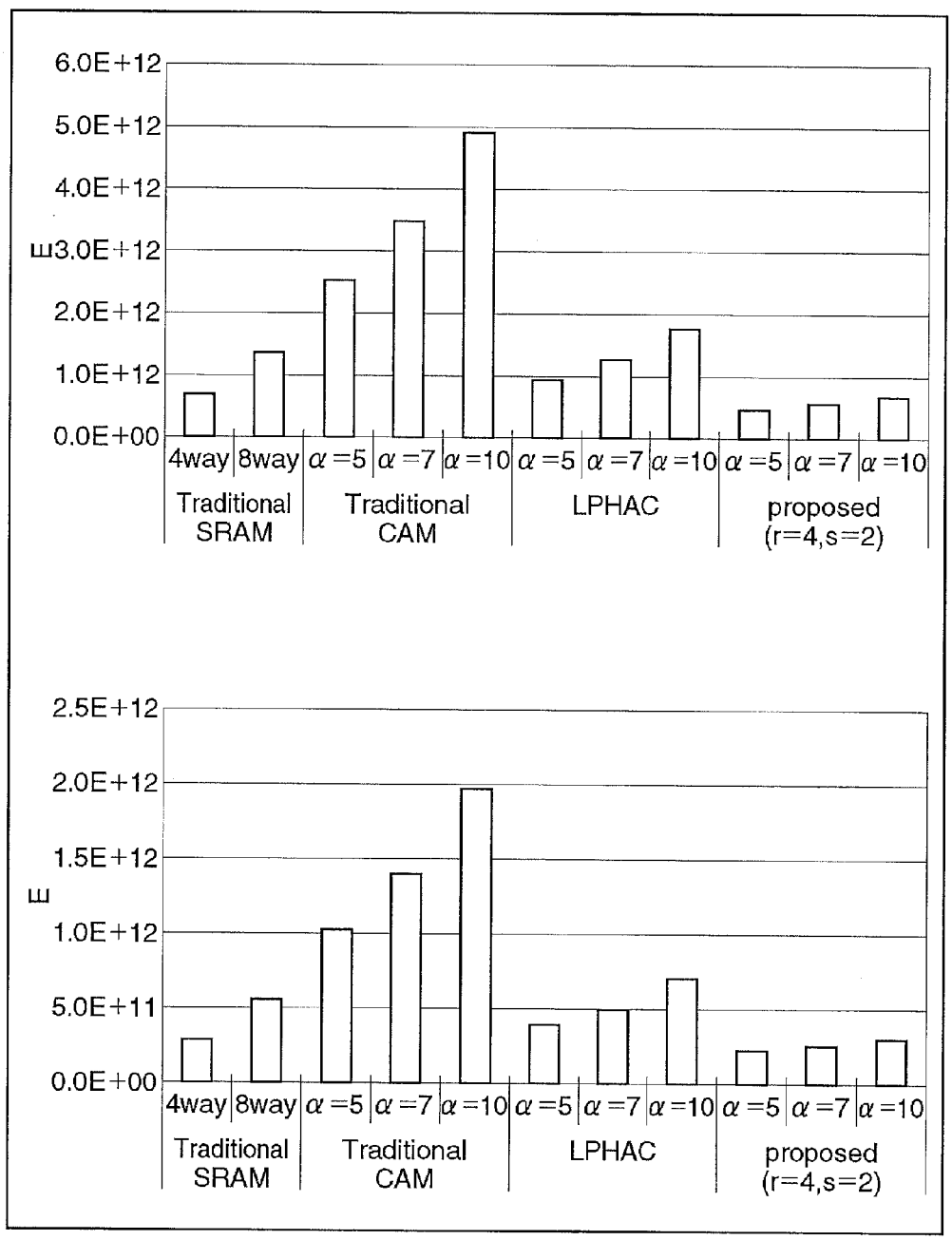
FIG. 16 is a diagram for describing an effect of the present invention.

Next, with reference to FIG. 16, power consumption of a traditional SRAM, a traditional CAM, the LPHAC method, and the cache memory according to the present invention is compared. Comparison targets are, from left to right in FIG. 16, traditional 4-way and 8-way SRAMs, a traditional 32-way CAM, the LPHAC method when the number of bits s of a CAM sub-tag address is s=8, and the cache memory (proposed) according the present invention when the number of ways r=4 and the number of bits s of a CAM sub-tag address is s=2. Moreover, in each case, a line size is 32 bytes and a cache capacity is 8 KB. In addition, for the traditional CAM, the LPHAC method, and the cache memory according to the present invention, FIG. 16 shows results of comparisons of power consumption by instruction caches (upper section of FIG. 16) and data caches (lower section of FIG. 16) performed by varying CAM power consumption α among α=5, 7, 10 from left to right in FIG. 16.

Compared to any other case, the traditional CAM is shown to have the highest power consumption for both instruction caches and data caches. Compared to the traditional CAM, the LPHAC method achieves suppression of power consumption. However, compared to the traditional SRAM, the power consumption—the CAM power consumption α≤7 in the LPHAC method—is lower than that of the SRAM with the number of ways r=8, while the power consumption under all the cases in the LPHAC method is higher than that of the SRAM with the number of ways r=4. In contrast, the power consumption by the cache memory according to the present invention is lower than both the traditional CAM and the LPHAC method regardless of α. When the CAM power consumption α=10, the power consumption by the cache memory according to the present invention is approximately similar to that of the traditional SRAM with the number of ways r=4. In other words, the power consumption by the cache memory according to the present invention is approximately similar regardless of the CAM power consumption α.

As shown, the cache memory according to the present invention is capable of reducing power consumption while suppressing a decline in cache hit rate.

Moreover, in the present specification, it is to be understood that steps describing a program not only include the processes sequentially executed according to described orders but also include processes which may not necessary be executed sequentially and which may be executed in parallel or individually.

EXPLANATION OF REFERENCE NUMERALS

11 CPU
12 address input unit
13 cache memory
14 main memory
21 index address extraction unit
22 tag address extraction unit
22a CAM sub-tag address extraction unit
22b SRAM sub-tag address extraction unit
41 decoding unit
42 sub-bank
51 CAM
52 SRAM
53 LRU management unit
53a LRU management list
54 readout unit
55 replacement unit
71 comparative search unit
72 output unit
73 writeback unit
74 generation management unit
74a generation management list
75 writeback management unit
76 write unit
77 rewrite unit
78 storage unit
81 generation judgment unit

The invention claimed is:

1. A cache memory comprising a CAM (Content Addressable Memory) with an associativity of n (where n is a natural number) and an SRAM (Static Random Access Memory), and storing or reading out corresponding data when a tag address is specified by a CPU (Central Processing Unit) connected to the cache memory, the tag address constituted by a first sub-tag address and a second sub-tag address, wherein
the cache memory classifies the corresponding data, according to the time at which a read request has been made, into at least a first generation which corresponds to a read request made at a recent time and a second generation which corresponds to a read request made at a time which is different from the recent time;
the first sub-tag address is managed by the CAM;
the second sub-tag address is managed by the SRAM; and
the cache memory allows a plurality of second sub-tag addresses to be associated with a same first sub-tag address.

2. A cache memory comprising a CAM (Content Addressable Memory) with an associativity of n (where n is a natural number) and an SRAM (Static Random Access Memory), and storing and reading out corresponding data when a tag address is specified by a CPU (Central Processing Unit) connected to the cache memory, the tag address constituted by a first sub-tag address and a second sub-tag address, the cache memory comprising:
a generation management unit that classifies the corresponding data, according to the time at which a read request has been made, into at least a first generation, which corresponds to a read request made at a recent time and a second generation which corresponds to a read request made at a time which is different from the recent time;
a first search unit that manages the first sub-tag address by using the CAM and that searches for a corresponding first sub-tag address by a comparison with a first sub-tag address of the tag address specified by the CPU;

a second search unit that manages the second sub-tag address by using the SRAM and that searches for a corresponding second sub-tag address by a comparison with a second sub-tag address of the tag address which includes a first sub-tag address retrieved by the first searching unit and which corresponds to the first generation data; and an output unit that outputs the data which is retrieved by the second search unit and which is stored in association with the second sub-tag address, wherein the cache memory allows a plurality of second sub-tag addresses to be associated with a same first sub-tag address.

3. The cache memory according to claim 2, wherein when the corresponding second sub-tag address cannot be retrieved by the comparison with a second sub-tag address of the tag address corresponding to the first generation data, the second search unit searches for a corresponding second sub-tag address by a comparison with the second sub-tag address of the tag address corresponding to the second generation data.

4. The cache memory according to claim 2, further comprising a replacement unit that reads out, from a connected main memory, data corresponding to the tag address for which the readout has been requested when data is not retrieved by the comparison with the first sub-tag address by the first search unit or when second generation data is not retrieved by the comparison with the second sub-tag address by the second search unit, and that replaces least recently read data among the second generation data managed by the generation management unit with data read out from the main memory and, at the same time, replaces the first sub-tag address and the second sub-tag address.

5. The cache memory according to claim 4, wherein the replacement unit permits an association of a plurality of the second sub-tag addresses to a single first sub-tag address and a replacement of the plurality of the second sub-tag addresses.

6. The cache memory according to claim 4, wherein the generation management unit manages whether the data belongs to the first generation or to the second generation in accordance with a generation management list based on the time at which each data item managed based on the second sub-tag address had been read, and when the least recently read data is replaced by the replacement unit with data read from the main memory, the generation management unit updates the generation management list by deleting the least recently read data with respect to the time that data managed according to the second sub-tag address is read and by setting the data read from the main memory as a most recently read time.

7. The cache memory according to claim 6, wherein the generation management unit manages generations based on the generation management list by classifying recently read data as first generation data and data read at a not-recent time as second generation data among the respective data managed according to the second sub-tag address.

8. The cache memory according to claim 2, wherein when the associativity n is 32 and the tag address is 24 bits, then the first sub-tag address is 2 bits and the second sub-tag address is 22 bits.

9. The cache memory according to claim 8, wherein among data managed according to the first sub-tag address with an associativity n of 32, the first generation data is limited to two highest ranked data items in a descending order of read times, with the most recent being the highest order.

10. A processor comprising:

a plurality of cache memories according to claim 2;

a CPU;

a first sub-tag address extraction unit that extracts the first sub-tag address from a tag address when a read or write request is made by the CPU for data specified by the tag address; and a second sub-tag address extraction unit that extracts a second sub-tag address from a tag address when a read or write request is made by the CPU for data specified by the tag address.

11. A method of controlling a cache memory having a CAM (Content Addressable Memory) with an associativity of n (where n is a natural number) and an SRAM (Static Random Access Memory), and storing and reading out corresponding data when a tag address is specified by a CPU (Central Processing Unit) connected to the cache memory, the tag address constituted by a first sub-tag address and a second sub-tag address, the cache memory control method comprising:

a generation management step of classifying the corresponding data, according to the time at which a read request has been made, into at least a first generation, which corresponds to a read request made at a recent time and a second generation which corresponds to a read request made at a time which is different from the recent time;

a first searching step of managing the first sub-tag address by using the CAM and searching for a corresponding first sub-tag address by a comparison with a first sub-tag address of the tag address specified by the CPU;

a second searching step of managing the second sub-tag address by using the SRAM and searching for a corresponding second sub-tag address by a comparison with a second sub-tag address of the tag address which includes a first sub-tag address retrieved in the first searching step and which corresponds to the first generation data; and an outputting step of outputting the data which is retrieved in the second searching step and which is stored in association with the second sub-tag address, wherein the cache memory control method allows an association of a plurality of second sub-tag addresses with a same first sub-tag address.

* * * * *